United States Patent
Nozawa et al.

(10) Patent No.: US 10,481,485 B2
(45) Date of Patent: Nov. 19, 2019

(54) MASK BLANK, TRANSFER MASK, METHOD OF MANUFACTURING TRANSFER MASK AND METHOD OF MANUFACTURING SEMICONDUCTOR DEVICE

(71) Applicant: HOYA CORPORATION, Tokyo (JP)

(72) Inventors: Osamu Nozawa, Tokyo (JP); Takenori Kajiwara, Tokyo (JP); Ryo Ohkubo, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 106 days.

(21) Appl. No.: 15/571,131

(22) PCT Filed: May 10, 2016

(86) PCT No.: PCT/JP2016/063843
§ 371 (c)(1),
(2) Date: Nov. 1, 2017

(87) PCT Pub. No.: WO2016/185941
PCT Pub. Date: Nov. 24, 2016

(65) Prior Publication Data
US 2018/0259841 A1    Sep. 13, 2018

(30) Foreign Application Priority Data
May 15, 2015   (JP) .................................. 2015-100288

(51) Int. Cl.
- *G03F 1/32* (2012.01)
- *G03F 1/50* (2012.01)
- *G03F 1/54* (2012.01)
- *G03F 1/74* (2012.01)
- *G03F 1/78* (2012.01)
- *G03F 1/80* (2012.01)

(52) U.S. Cl.
CPC ................. *G03F 1/32* (2013.01); *G03F 1/50* (2013.01); *G03F 1/54* (2013.01); *G03F 1/74* (2013.01); *G03F 1/78* (2013.01); *G03F 1/80* (2013.01)

(58) Field of Classification Search
CPC ..... G03F 1/32; G03F 1/50; G03F 1/54; G03F 1/74; G03F 1/78; G03F 1/80
USPC ............................................................ 430/5
See application file for complete search history.

(56) References Cited

U.S. PATENT DOCUMENTS

| | | |
|---|---|---|
| 5,876,877 A | 3/1999 | Hanyu et al. |
| 2002/0058186 A1 | 5/2002 | Nozawa et al. |
| 2003/0047691 A1 | 3/2003 | Musil et al. |
| 2005/0053845 A1 | 3/2005 | Becker et al. |
| 2005/0190450 A1 | 9/2005 | Becker et al. |
| 2005/0260504 A1 | 11/2005 | Becker et al. |
| 2007/0076833 A1 | 4/2007 | Becker et al. |
| 2010/0092874 A1 | 4/2010 | Nozawa et al. |

FOREIGN PATENT DOCUMENTS

| | | |
|---|---|---|
| JP | 04-233541 A | 8/1992 |
| JP | 06-167802 A | 6/1994 |
| JP | 2002-162726 A | 6/2002 |
| JP | 2004-537758 A | 12/2004 |
| JP | 2005-208660 A | 8/2005 |
| JP | 2010-009038 A | 1/2010 |
| JP | 2014-211501 A | 11/2014 |

OTHER PUBLICATIONS

International Search Report for PCT/JP2016/063843 dated Aug. 2, 2016 [PCT/ISA/210].
Written Opinion for PCT/JP2016/063843 dated Aug. 2, 2016 [PCT/ISA/237].

*Primary Examiner* — Christopher G Young
(74) *Attorney, Agent, or Firm* — Kilpatrick Townsend & Stockton LLP

(57) ABSTRACT

A mask blank comprising an etching stopper film. The mask blank comprises a thin film for pattern formation on a main surface of a transparent substrate, and is featured in that: the thin film for pattern formation contains silicon, an etching stopper film is provided between the transparent substrate and the thin film for pattern formation, and the etching stopper film contains silicon, aluminum, and oxygen.

29 Claims, 4 Drawing Sheets

MASK BLANK, TRANSFER MASK, METHOD OF MANUFACTURING TRANSFER MASK AND METHOD OF MANUFACTURING SEMICONDUCTOR DEVICE

CROSS REFERENCE TO RELATED APPLICATIONS

This application is a National Stage of International Application No. PCT/JP2016/063843 filed May 10, 2016, claiming priority based on Japanese Patent Application No. 2015-100288 filed May 15, 2015, the contents of all of which are incorporated herein by reference in their entirety.

TECHNICAL FIELD

The present invention relates to a mask blank, a transfer mask manufactured using the mask blank, and a method of manufacturing the same. Furthermore, the present invention relates to a method of manufacturing a semiconductor device using the transfer mask.

BACKGROUND ART

Generally, in the manufacturing steps of semiconductor devices, fine patterns are formed using the photolithographic method. Furthermore, many transfer masks are usually used in forming these fine patterns. To make semiconductor device patterns finer, it is necessary not only to make the mask pattern formed on the transfer mask finer, but also to shorten the wavelength of the exposure light source used in photolithography. Regarding the exposure light sources used in the manufacture of semiconductor devices, a shift to shorter wavelengths has been seen in recent years from the KrF excimer laser (wavelength of 248 nm) to the ArF excimer laser (wavelength of 193 nm).

The types of transfer masks include halftone phase shift masks, in addition to binary masks including a light shielding film pattern made of a chrome based material on the conventional transparent substrate. As disclosed in Patent Document 1, molybdenum silicide (MoSi) based materials are widely used for phase shift films of halftone phase shift masks. Furthermore, as disclosed in Patent Document 2, phase shift masks including a phase shift film having a relatively high transmittance with respect to exposure light despite being a molybdenum silicide material are also known, such as one having a transmittance of 9% or more.

In Patent Document 3, there is disclosed a defect repairing technique according to which the black defect portions are etched and removed by irradiating black defect portions of the light shielding film with an electron beam while xenon difluoride ($XeF_2$) gas is supplied thereto (hereinafter, defect repair performed by irradiation of charged particles such as electron beams is simply referred to as EB defect repair). While this EB defect repair was used initially for the repair of black defects in the absorber film of reflective masks for EUV lithography (Extreme Ultraviolet Lithography), it has also come to be used for the repair of black defects in MoSi halftone masks in recent years.

Regarding phase shift films made of a molybdenum silicide based material and silicon based material, it is common to form phase shift patterns by dry etching, with a fluorine based gas serving as the etching gas. However, phase shift films of these materials do not have very high etching selectivity with respect to substrates made of a glass material in dry etching with a fluorine based gas. In Patent Document 4, an etching stopper film made of $Al_2O_3$, etc., which is a material having high durability to dry etching with a fluorine based gas, is interposed between the substrate and the phase shift film. This configuration makes it possible to inhibit the surface of the substrate from being dug into when forming a phase shift pattern on a phase shift film by dry etching with a fluorine based gas.

PRIOR ART DOCUMENTS

Patent Documents

Patent Document 1: Japanese Patent Application Publication 2002-162726
Patent Document 2: Japanese Patent Application Publication 2010-9038
Patent Document 3: PCT Application Japanese Translation Publication 2004-537758
Patent Document 4: Japanese Patent Application Publication 2005-208660

SUMMARY OF THE INVENTION

Problem to be Solved by the Invention

Etching stopper films made of $Al_2O_3$ are advantageous in that they have excellent durability to dry etching with a fluorine based gas and are able to inhibit the substrate from being dug into when dry etching the phase shift film. Furthermore, etching stopper films made of $Al_2O_3$ also have high resistance to EB defect repair and are able to inhibit such damage to the substrate that is prone to occur when performing EB defect repair against black defect portions of the phase shift film. However, etching stopper films made of $Al_2O_3$ tend to have low resistance to chemical cleaning. During the process of manufacturing phase shift masks (transfer masks) from mask blanks, cleaning by chemicals is performed many times. Furthermore, cleaning by chemicals is periodically performed for finished phase shift masks as well. With such cleaning, an ammonia-hydrogen peroxide or TMAH (tetramethyl ammonium hydroxide) aqueous solution is frequently used as a cleaning solution, while etching stopper films made of $Al_2O_3$ have low resistance to these cleaning solutions.

For example, when cleaning using ammonia-hydrogen peroxide is performed for a phase shift mask that includes, on a transparent substrate made of glass, an etching stopper film made of $Al_2O_3$ and a phase shift film with a phase shift pattern formed thereon, the etching stopper film gradually dissolves from its surface at light transmissive portions or areas where the phase shift film of the phase shift mask does not exist and the etching stopper film surface is exposed, with the dissolution proceeding even to the state in which the main surface of the substrate becomes exposed at the light transmissive portions. Then, if further cleaning is performed, the etching stopper film directly under patterned portions where the phase shift film exists will also dissolve from the side wall side of the phase shift film toward the inside. Since this phenomenon involving the dissolution of the etching stopper film proceeds from both side wall sides, the width of the etching stopper film that remains without dissolving will be smaller than the pattern width of the phase shift film. When such a state is reached, the phenomenon of dropping patterns in the phase shift film is prone to occur.

Furthermore, when a phase shift mask is placed in the exposure apparatus and transferred by exposure to a transfer target (such as a resist film on a semiconductor wafer), exposure light enters from the side of the main surface that is opposite the main surface of the transparent substrate of the phase shift mask on which a phase shift pattern is provided, and enters the phase shift pattern via the etching stopper film. The pattern formed on the phase shift film of a phase shift mask is designed on the assumption that an etching stopper film exists between the transparent substrate and the phase shift film. For this reason, in the state in which the etching stopper film of the phase shift mask has dissolved, the optical characteristics anticipated at the time of phase shift pattern design may not be sufficiently achieved.

If the etching stopper film has dissolved in the vicinity of the side walls of phase shift patterns where the phase shift effect is necessary, it is difficult for the expected phase shift effect to be fully achieved. In the case of phase shift masks of the high transmittance type as disclosed in Patent Document 2 with increased transmittance of the phase shift film with respect to exposure light in order to achieve a higher phase shift effect, decreases in the phase shift effect tend to be more conspicuous.

Etching stopper films made of $Al_2O_3$ suffer from lower transmittance with respect to exposure light than synthetic quartz glass used as the material for transparent substrates of phase shift masks. In the case of phase shift masks in which the ArF excimer laser is applied to exposure light, this tendency presents itself more conspicuously. An etching stopper film made of $Al_2O_3$ will be left at light transmissive portions as well when the phase shift mask is completed. A decrease in the transmittance of exposure light at light transmissive portions will lead to a decrease in the phase shift effect in the phase shift mask.

On the other hand, even in mask blanks for manufacturing binary transfer masks including a light shielding film pattern having high optical density on the transparent substrate, a transition metal silicide based material is used as the material for the light shielding film. Even when forming a pattern on this light shielding film of a transition metal silicide based material, dry etching with fluorine gas is used. The transition metal silicide based material for this light shielding film tends not to have a higher nitridation degree or oxidation degree compared to the transition metal silicide based material of the phase shift film partly because high optical density is required. For this reason, the etching selectivity between the light shielding film and the transparent substrate in dry etching with a fluorine based gas tends to be greater than the selectivity between the phase shift film and the transparent substrate. However, there are cases in which etching selectivity of such a degree is insufficient to inhibit etching of the transparent substrate, so it is desired that an etching stopper film be provided between the transparent substrate and the light shielding film.

Furthermore, in manufacturing a transfer mask from a mask blank having this light shielding film of a transition metal silicide based material, EB defect repair is performed even when a black defect portion is discovered in the pattern of the light shielding film. In order to inhibit damage to the substrate when carrying out EB defect repair, it is effective to provide an etching stopper film. For etching stopper films in these binary transfer masks, in the same way as in the case of phase shift masks, it is necessary that the material have high resistance to chemical cleaning and also desired that the material have high transmittance with respect to exposure light.

The present invention has been created to solve the abovementioned traditional problems and, in the case of mask blanks including a thin film for pattern formation, such as a phase shift film or light shielding film, on a transparent substrate and configured with an etching stopper film interposed between the transparent substrate and the thin film for pattern formation, aims to provide a mask blank including an etching stopper film that has high durability to the dry etching with a fluorine based gas used for patterning thin films for pattern formation, high resistance to chemical cleaning, and high transmittance with respect to exposure light. Furthermore, the present invention aims to provide a transfer mask manufactured using such a mask blank. In addition, the present invention aims to provide a method of manufacturing such a transfer mask. Also, the present invention aims to provide a method of manufacturing a semiconductor device using such a transfer mask.

Means for Solving Problem

In order to solve the abovementioned problems, the present invention has the following configuration.
(Configuration 1)
A mask blank, including a thin film for pattern formation on the main surface of a transparent substrate,
wherein the thin film for pattern formation contains silicon;
wherein an etching stopper film is provided between the transparent substrate and the thin film for pattern formation; and
wherein the etching stopper film contains silicon, aluminum, and oxygen.
(Configuration 2)
The mask blank according to configuration 1, wherein the oxygen content of the etching stopper is 60 atom % or more.
(Configuration 3)
The mask blank according to configuration 1 or 2, wherein the ratio of the silicon content to the total content of silicon and aluminum in the etching stopper film is 4/5 or less in terms of atom %.
(Configuration 4)
The mask blank according to any one of configurations 1 to 3, wherein the etching stopper film is made of silicon, aluminum, and oxygen.
(Configuration 5)
The mask blank according to any one of configurations 1 to 4, wherein the etching stopper film is formed in contact with the main surface of the transparent substrate.
(Configuration 6)
The mask blank according to any one of configurations 1 to 5, wherein the etching stopper film has a thickness of 3 nm or more.
(Configuration 7)
The mask blank according to any one of configurations 1 to 6, wherein the thin film for pattern formation contains silicon and nitrogen.
(Configuration 8)
The mask blank according to any one of configurations 1 to 6, wherein the thin film for pattern formation contains a transition metal, silicon, and nitrogen.
(Configuration 9)
The mask blank according to any one of configurations 1 to 8, wherein the thin film for pattern formation is a phase shift film.
(Configuration 10)
The mask blank according to configuration 9, wherein the phase shift film has a function to transmit exposure light at a transmittance of 1% or more, and a function to cause a phase difference of not less than 150 and not more than 180 degrees between the exposure light having transmitted through the phase shift film and the exposure light having passed through air for the same distance as the thickness of the phase shift film.

(Configuration 11)

The mask blank according to configuration 9 or 10, wherein the mask blank includes a light shielding film on the phase shift film.

(Configuration 12)

A transfer mask having a transfer pattern on the thin film for pattern formation of the mask blank according to any one of configurations 1 to 8.

(Configuration 13)

A transfer mask having a transfer pattern on the phase shift film of the mask blank according to configuration 11, and having a pattern including a light shielding band on the light shielding film.

(Configuration 14)

A method of manufacturing a transfer mask using the mask blank according to any one of configurations 1 to 8, including the step of forming a transfer pattern on the thin film for pattern formation by dry etching.

(Configuration 15)

A method of manufacturing a transfer mask using the mask blank according to configuration 11, including the steps of:

forming a transfer pattern on the light shielding film by dry etching;

forming a transfer pattern on the phase shift film by dry etching with a fluorine based gas, with the light shielding film having the transfer pattern serving as a mask; and forming a pattern including a light shielding band on the light shielding film by dry etching.

(Configuration 16)

A method of manufacturing a semiconductor device, including the step of transferring by exposure a transfer pattern to a resist film on a semiconductor substrate using the transfer mask according to configuration 12 or 13.

(Configuration 17)

A method of manufacturing a semiconductor device, including the step of transferring by exposure a transfer pattern to a resist film on a semiconductor substrate using the transfer mask manufactured by the method of manufacturing a transfer mask according to configuration 14 or 15.

Effects of Invention

The mask blank of the present invention includes a thin film for pattern formation on the main surface of a transparent substrate, wherein the thin film for pattern formation contains silicon, an etching stopper film is provided between the transparent substrate and the thin film for pattern formation, and the etching stopper film contains silicon, aluminum, and oxygen. By configuring the mask blank in this way, the etching stopper film can simultaneously satisfy the following three characteristics: higher durability than that of a transparent substrate to dry etching with a fluorine based gas, which is performed when forming a pattern on a thin film for pattern formation; high resistance to chemical cleaning; and high transmittance with respect to exposure light.

DESCRIPTION OF EMBODIMENTS

Figure 1:
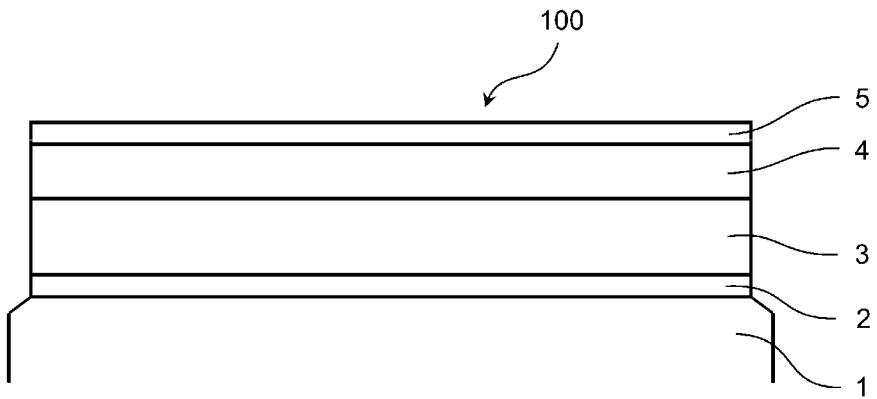
FIG. 1 is a cross-sectional drawing illustrating a configuration of a mask blank according to a first embodiment of the present invention.

First, the circumstances leading to the completion of the present invention will be described. The present inventors engaged in diligent research to solve the technical problems of the etching stopper films made of $Al_2O_3$. As the material for etching stopper films, while $Al_2O_3$ has high durability to dry etching with a fluorine based gas, it does not have very high transmittance with respect to exposure light of the ArF excimer laser (wavelength: approximately 193 nm), and has low resistance to cleaning solutions used for cleaning transfer masks. On the other hand, as the main material for transparent substrates, while $SiO_2$ is a material that has high transmittance with respect to exposure light of the ArF excimer laser (wavelength: approximately 193 nm) and high resistance to cleaning solutions used for cleaning transfer masks, it is also a material that is prone to etching by dry etching with a fluorine based gas. As a result of diligent study, the present inventors discovered the possibility of simultaneously satisfying the three characteristics of durability to dry etching with a fluorine based gas, high transmittance with respect to exposure light of the ArF excimer laser (wavelength: approximately 193 nm), and high resistance to cleaning solutions used in cleaning transfer masks, by forming an etching stopper film from a material that combines $Al_2O_3$ and $SiO_2$.

Etching stopper films were manufactured from materials that combine $Al_2O_3$ and $SiO_2$ and verified, revealing that, in terms of durability to dry etching with a fluorine based gas, while they are inferior to etching films made of only $Al_2O_3$, they can function sufficiently as etching stopper films. For transmittance with respect to exposure light of the ArF excimer laser, it was found that although they are inferior to materials made of only $SiO_2$, their transmittance is remarkably higher than that of etching stopper films made of only $Al_2O_3$. In addition, it was also found that their resistance to cleaning solutions (such as ammonia-hydrogen peroxide and TMAH) is inferior to materials made of only $SiO_2$, but remarkably higher than etching stopper films made of only $Al_2O_3$. Furthermore, the processing of irradiating a portion with an electron beam while supplying xenon difluoride ($XeF_2$) gas thereto, which is performed in EB defect repairing, was performed with respect to the etching stopper film using a material that combines $Al_2O_3$ and $SiO_2$, which revealed that while they are inferior to etching stopper films made of only $Al_2O_3$, they also have sufficiently high durability compared to materials made of only $SiO_2$.

As a result of diligent study of the foregoing, a conclusion is reached that in order to solve the technical problems facing etching stopper films made of $Al_2O_3$, it is necessary to form an etching stopper film from a material that contains silicon, aluminum, and oxygen. In other words, the mask blank of the present invention has a thin film for pattern formation on the main surface of a transparent substrate, wherein the thin film for pattern formation contains silicon, an etching stopper film is provided between the transparent substrate and the thin film for pattern formation, and the etching stopper film contains silicon, aluminum, and oxygen. Next, each embodiment of the present invention will be described.

First Embodiment

[Mask Blank and the Manufacture Thereof]

The mask blank according to the first embodiment of the present invention is used to manufacture phase shift masks (transfer masks), with the thin film for pattern formation serving as a phase shift film, which is a film that imparts a predetermined transmittance and phase difference to exposure light. FIG. 1 illustrates the configuration of the mask blank of this first embodiment. The mask blank 100 according to this first embodiment includes, on the main surface of transparent substrate 1, etching stopper film 2, phase shift film (thin film for pattern formation) 3, light shielding film 4, and hard mask film 5.

Transparent substrate 1 is not particularly limited as long as it has high transmittance with respect to exposure light. In the present invention, synthetic quartz glass substrates and other types of glass substrates (such as, for example, soda-lime glass and aluminosilicate glass) may be used. Among these substrates, synthetic quartz glass substrates are particularly suitable for substrates of the mask blank of the present invention used in forming high-definition transfer patterns, because they have high transmittance in the ArF excimer laser and shorter wavelength regions. Note, however, that all these glass substrates are materials that are prone to being etched by dry etching with a fluorine based gas. For this reason, it is important to provide etching stopper film 2 on transparent substrate 1.

Figure 2:
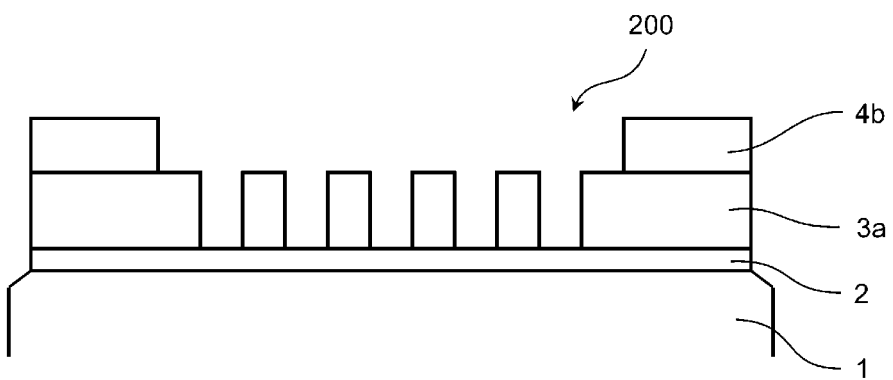
FIG. 2 is a cross-sectional drawing illustrating a configuration of a phase shift mask according to the first embodiment of the present invention.

Etching stopper film 2 is formed from materials that contain silicon, aluminum, and oxygen. This etching stopper film 2 is left at least across the entire surface of the transfer pattern formation region without being removed at the stage in which phase shift mask 200 is completed (see FIG. 2). In other words, etching stopper film 2 is also left in light transmissive portions, which are regions of phase shift patterns without phase shift film 3. For this reason, etching stopper film 2 is preferably formed in contact with transparent substrate 1 with no other film interposed between etching stopper film 2 and transparent substrate 1.

The higher the transmittance with respect to exposure light, the more suitable etching stopper film 2 is. However, since sufficient etching selectivity between transparent substrate 1 and etching stopper film 2 in fluorine based gas is required at the same time, it is difficult to make the transmittance of etching stopper film 2 with respect to exposure light the same as that of transparent substrate 1 (in other words, assuming the transmittance of transparent substrate 1 (synthetic quartz glass) with respect to exposure light is 100%, the transmittance of etching stopper film 2 will be less than 100%). Assuming the transmittance of transparent substrate 1 with respect to exposure light is 100%, the transmittance of etching stopper film 2 is preferably 95% or more, more preferably 96% or more, and even more preferably 97% or more.

Etching stopper film 2 preferably has an oxygen content of 60 atom % or more. This is because in order to have a transmittance with respect to exposure light of the above value or more, etching stopper film 2 must contain more oxygen. Furthermore, as silicon bound to oxygen tends to have higher resistance to chemical cleaning (in particular, alkaline cleaning with ammonia-hydrogen peroxide, TMAH, etc.) than silicon not bound to oxygen, it is preferable to increase the ratio of silicon bound to oxygen to all the silicon existing in etching stopper film 2. On the other hand, etching stopper film 2 preferably has an oxygen content of 66 atom % or less.

For etching stopper film 2, the ratio of the silicon (Si) content [atom %] to the total content [atom %] of silicon (Si) and aluminum (Al) (hereinafter, referred to as the ratio of Si/[Si+Al]) is preferably ⅘ or less. By making the ratio of Si/[Si+Al] of etching stopper film 2 to be ⅘ or less, the etching rate of etching stopper film 2 in dry etching with a fluorine based gas can be ⅓ or less the etching rate of transparent substrate 1 (an etching selection ratio of three fold or more can be obtained between transparent substrate 1 and etching stopper film 2). Furthermore, the ratio of Si/[Si+Al] in etching stopper film 2 is more preferably ¾ or less, and even more preferably ⅔ or less. When the ratio of Si/[Si+Al] is ⅔ or less, the etching rate of etching stopper film 2 in dry etching with a fluorine based gas can be ⅕ or less of the etching rate of transparent substrate 1 (an etching selection ratio of five fold or more can be obtained between transparent substrate 1 and etching stopper film 2).

For etching stopper film 2, the ratio of Si/[Si+Al] of silicon (Si) and aluminum (Al) is preferably ⅕ or more. By making the ratio of Si/[Si+Al] of etching stopper film 2 to be ⅕ or more, the transmittance of etching stopper film 2 can be 95% or more assuming the transmittance of transparent substrate 1 (synthetic quartz glass) with respect to exposure light is 100%. Furthermore, resistance to chemical cleaning can be simultaneously increased. Furthermore, the ratio of Si/[Si+Al] in etching stopper film 2 is preferably ⅓ or more. If the ratio of Si/[Si+Al] is ⅓ or more, the transmittance of etching stopper film 2 can be 97% or more assuming the transmittance of transparent substrate 1 (synthetic quartz glass) with respect to exposure light is 100%.

For etching stopper film 2, the content of metals other than aluminum is preferably 2 atom % or less, more preferably 1 atom % or less, and even more preferably at the lowest detection limit or less as determined by composition analysis using X ray photoelectron spectroscopy. This is because the presence of a metal other than aluminum in etching stopper film 2 serves as a factor decreasing transmittance with respect to exposure light. Furthermore, for etching stopper film 2, the total content of elements other than silicon, aluminum, and oxygen is preferably 5 atom % or less, and more preferably 3 atom % or less.

Etching stopper film 2 is preferably formed using a material made of silicon, aluminum, and oxygen. A material made of silicon, aluminum, and oxygen shall mean a material that only contains, in addition to the above constituent elements, those elements that come to be unavoidably contained in etching stopper film 2 when forming the film by the sputtering method (including rare gases such as helium (He), neon (Ne), argon (Ar), krypton (Kr), and xenon (Xe), hydrogen (H), and carbon (C)). Minimizing the presence of other elements that may bond with silicon or aluminum in etching stopper film 2 can significantly increase the ratio of the bonds between silicon and oxygen and the bonds between aluminum and oxygen in etching stopper film 2. Thus, higher etching durability to dry etching with a fluorine based gas, higher resistance to chemical cleaning, and higher transmittance with respect to exposure light can be achieved.

Etching stopper film 2 preferably has an amorphous structure. More specifically, etching stopper film 2 preferably has an amorphous structure including a bond of silicon and oxygen and a bond of aluminum and oxygen. Transmittance with respect to exposure light can be increased while the surface roughness of etching stopper film 2 can be improved.

Etching stopper film 2 preferably has a thickness of 3 nm or more. While forming etching stopper film 2 from a material containing silicon, aluminum, and oxygen significantly decreases the etching rate in fluorine based gas, it does not mean that no etching will occur. Furthermore, it does not mean that no film reduction will occur when etching stopper film 2 is subjected to chemical cleaning. Taking into consideration the influence of dry etching with a fluorine based gas and the influence of chemical cleaning that have been performed until transfer masks are manufactured from mask blanks, etching stopper film 2 desirably has a thickness of 3 nm or more. Etching stopper film 2 preferably has a thickness of 4 nm or more, and more preferably 5 nm or more.

For etching stopper film 2, although a material with high transmittance with respect to exposure light has been applied, transmittance decreases as the thickness becomes greater. Furthermore, etching stopper film 2 has a refractive index higher than that of the material for forming transparent substrate 1, and the thicker the thickness of etching stopper film 2, the greater the influence it has when designing the actual mask pattern to be formed on phase shift film 3 (the pattern to which bias correction, OPC, SRAF, etc. have been added). Meanwhile, considering these points, etching stopper film 2 is desirably 20 nm or less, preferably 15 nm or less, and more preferably 10 nm or less.

Etching stopper film 2 preferably has a refractive index n with respect to exposure light of the ArF excimer laser (hereinafter, simply referred to as refractive index n) of 1.73 or less, and more preferably 1.72 or less. This is in order to minimize the influence it has when designing the actual mask pattern to be formed on phase shift film 3. Etching stopper film 2 may not have the same refractive index n as transparent substrate 1 since it is formed from an aluminum containing material. Etching stopper film 2 is formed so as to have a refractive index n of 1.57 or more. On the one hand, for etching stopper film 2, the extinction coefficient k (hereinafter, simply referred to as extinction coefficient k) for exposure light of the ArF excimer laser is preferably 0.04 or less. This is in order to increase the transmittance of etching stopper film 2 with respect to exposure light. Etching stopper film 2 is formed from a material having an extinction coefficient k of 0.000 or more.

Etching stopper film 2 preferably has high composition uniformity in the thickness direction (difference in content of each constituent element in the thickness direction is within a fluctuation range of 5 atom % or less). On the other hand, etching stopper film 2 may have a film structure having a gradient composition in the thickness direction. In this case, a gradient composition in which the ratio of Si/[Si+Al] on the transparent substrate 1 side of etching stopper film 2 is higher than the ratio of Si/[Si+Al] on the phase shift film 3 side is preferable. This is because, in etching stopper film 2, the phase shift film 3 side desirably has high durability to dry etching with a fluorine based gas and high resistance to chemicals as a priority, while the transparent substrate 1 side desirably has high transmittance with respect to exposure light.

Another film may be interposed between transparent substrate 1 and etching stopper film 2. In this case, a material having a higher transmittance with respect to exposure light than etching stopper film 2 and a small refractive index n needs to be applied to such other films. When phase shift masks are manufactured from mask blanks, a laminated structure of this another film and etching stopper film 2 exists at light transmissive portions, which are regions of phase shift masks without phase shift film 3. This is because light transmissive portions must have high transmittance with respect to exposure light and there is a need to increase the overall transmittance of this laminated structure with respect to exposure light. Materials of other films may include, for example, a material made of silicon and oxygen, or a material containing, in addition to these, one or more elements selected from among hafnium, zirconium, titanium, vanadium, and boron. The abovementioned other film may be formed from a material containing silicon, aluminum, and oxygen and has a higher ratio of Si/[Si+Al] than etching stopper film 2. Even in this case, the other film will have a higher transmittance with respect to exposure light and a small refractive index n (coming closer to the material of transparent substrate 1).

Phase shift film 3 is made of a material containing silicon, transmits light of such intensity that does not substantially contribute to exposure, and has a predetermined phase difference. Specifically, this phase shift film 3 is patterned to form portions where phase shift film 3 is left and portions where it is not left, such that the light that has transmitted through portions without phase shift film 3 (ArF excimer laser exposure light) and the light that has transmitted through phase shift film 3 (light of such intensity that does not substantially contribute to exposure) have substantially reversed phases (a predetermined phase difference). In this way, each light is made to cancel the other out as one light passes into the area of the other light by diffraction phenomenon, reducing light intensity at the boundary portion to substantially zero and enhancing the contrast at the boundary portion, i.e., resolution.

Phase shift film 3 preferably functions to transmit exposure light at a transmittance of 1% or more (transmittance), in addition to causing a phase difference of between 150 and 180 degrees between the exposure light having transmitted through the phase shift film and the exposure light having passed through air for the same distance as the thickness of the phase shift film. Furthermore, more preferably, phase shift film 3 has a transmittance of 2% or more. Phase shift film 3 preferably has a transmittance of 30% or less, and more preferably 20% or less.

Recently, a problem has arisen in which, when a halftone phase shift mask is placed in the mask stage of an exposure apparatus and transferred by exposure to a transfer target (such as a resist film on a semiconductor wafer), the best focus of exposure transfer varies greatly depending on the pattern line width of the phase shift pattern (in particular, the pattern pitch of the line and space pattern). In order to minimize the fluctuation range of best focus due to the pattern line width of the phase shift pattern, the predetermined phase difference in phase shift film 3 is preferably set to 170 degrees or less.

Phase shift film 3 preferably has a thickness of 80 nm or less, and more preferably 70 nm or less. Furthermore, in order to minimize the fluctuation range of best focus due to the pattern line width of the abovementioned phase shift pattern, it is particularly preferable that phase shift film 3 has a thickness of 65 nm or less. Phase shift film 3 preferably has a thickness of 50 nm or more. This is because a thickness of 50 nm or more is necessary to cause phase shift film 3 to have a phase difference of 150 degrees or more while forming phase shift film 3 from an amorphous material.

In phase shift film 3, in order to satisfy the abovementioned optical characteristics and conditions pertaining to film thickness, the refractive index n of the phase shift film with respect to exposure light (ArF exposure light) is preferably 1.9 or more, and more preferably 2.0 or more. Furthermore, phase shift film 3 preferably has a refractive index n of 3.1 or less, and more preferably 2.7 or less. The extinction coefficient k of phase shift film 3 with respect to ArF exposure light is preferably 0.26 or more, and more preferably 0.29 or more. Furthermore, the extinction coefficient k of phase shift film 3 is preferably 0.62 or less, and more preferably 0.54 or less.

On the other hand, as described below, phase shift film 3 may be structured such that at least one set of a low transmittance layer formed from a material relatively low in transmittance with respect to exposure light and a high transmittance layer formed from a material relatively high in transmittance with respect to exposure light are laminated. In this case, the low transmittance layer is preferably formed from a material that has a refractive index n with respect to ArF exposure light of less than 2.5 (preferably 2.4 or less, more preferably 2.2 or less, and even more preferably 2.0 or less), and an extinction coefficient k of 1.0 or more (preferably 1.1 or more, more preferably 1.4 or more, and even more preferably 1.6 or more). Furthermore, the high transmittance layer is preferably formed from a material that has a refractive index n with respect to ArF exposure light of 2.5 or more (preferably 2.6 or more), and an extinction coefficient k of less than 1.0 (preferably 0.9 or less, more preferably 0.7 or less, and even more preferably 0.4 or less).

Note that the refractive index n and extinction coefficient k of thin films including phase shift film 3 are not determined by the composition of the thin film alone. The film density and crystal state of the thin film also influence its refractive index n and extinction coefficient k. For this reason, when forming a thin film by reactive sputtering, conditions are adjusted such that the thin film has a desired refractive index n and extinction coefficient k. In order to cause phase shift film 3 to have the abovementioned ranges of refractive index n and extinction coefficient k, while it is effective to adjust the ratio of rare gases to reactive gases (such as oxygen gas and nitrogen gas) in the mixed gas when forming films by reactive sputtering, options are not limited thereto. There are various ways, including the pressure within the film forming chamber at the time of forming films by reactive sputtering, electric power applied to the sputtering target, and positional relations such as the distance between the target and transparent substrate 1. Furthermore, these film forming conditions are film forming device specific and are adjusted as necessary such that formed phase shift film 3 has a desired refractive index n and extinction coefficient k.

Generally, phase shift film 3 made of a silicon containing material is patterned by dry etching with a fluorine based gas. Transparent substrate 1 made of a glass material is prone to being etched by dry etching with a fluorine based gas and has particularly low resistance to fluorine based gas containing carbon. For this reason, when patterning phase shift film 3, dry etching with a fluorine based gas that does not contain carbon (such as $SF_6$) is frequently applied as the etching gas. In the case of dry etching with a fluorine based gas, it is relatively easy to increase the anisotropy of etching. However, when patterning phase shift film 3 by dry etching with a fluorine based gas with an etching mask pattern such as resist pattern serving as a mask, if dry etching is terminated at the stage when the etching has first reached the lower end of phase shift film 3 (this is called just etching, and the time it takes from the start of etching to the just etching stage is called the just etching time), side walls of the phase shift pattern will have low verticality, affecting the exposure transfer performance as a phase shift mask. Furthermore, the pattern formed on phase shift film 3 has an in-plane density difference in the mask blank, slowing down the progress of dry etching at portions in which the pattern is relatively dense.

Under these circumstances, when carrying out dry etching of phase shift film 3, even after reaching the just etching stage, further additional etching (over-etching) is continued in order to increase the verticality of the side walls of the phase shift pattern and increases the in-plane CD uniformity of the phase shift pattern (the time from the end of just etching to the end of over-etching is called the over-etching time). For cases in which there is no etching stopper film 2 between transparent substrate 1 and phase shift film 3, when over-etching is performed against phase shift film 3, etching of the surface of transparent substrate 1 progresses simultaneously with the progression of the etching of pattern side walls of phase shift film 3. Accordingly, over-etching cannot be carried out for too long (it used to be terminated when the transparent substrate has been dug into by approximately 4 nm from the surface), and there is a limit to what could be done to increase the verticality of the phase shift pattern.

For the purpose of increasing the verticality of the side walls of the phase shift pattern, a process is performed to make the bias voltage applied when dry etching phase shift film 3 higher than conventional ones (hereinafter, referred to as "high bias etching"). With this high bias etching, a phenomenon in which transparent substrate 1 in the vicinity of a side wall of the phase shift pattern is locally dug into by etching, producing so-called microtrenches, has been problematic. The production of these microtrenches is thought to be due to the fact that the etching gas, ionized by charge-up caused by the application of bias voltage to transparent substrate 1, goes around to the side wall side of the phase shift pattern, which has a lower resistance than transparent substrate 1.

On the other hand, if an etching stopper film made of $Al_2O_3$ is provided between transparent substrate 1 and phase shift film 3, because the etching amount of the etching stopper film will be minute even when over-etching is performed with respect to phase shift film 3, it is possible to accurately form phase shift patterns and inhibit microtrenches that are prone to be produced by high bias etching. However, if chemical cleaning is performed thereafter, the phenomenon in which the etching stopper film dissolves and phase shift patterns drop is prone to occur. Because this etching stopper film 2 of the first embodiment is formed from a material containing silicon, aluminum, and oxygen, it follows that etching stopper film 2 will not disappear even when over-etching is performed with respect to phase shift film 3, etching stopper film 2 can inhibit microtrenches, which are prone to be produced by high bias etching, etching stopper film 2 has sufficiently high resistance to chemical cleaning, which will be performed thereafter, and the phenomenon of dropping phase shift patterns is inhibited.

Phase shift film 3 can be formed from a material containing silicon and nitrogen. By having silicon contain nitrogen, it is possible to make the refractive index n greater than that of materials made of only silicon (a large phase difference can be achieved with thinner thickness), in addition to making the extinction coefficient k small (it is possible to make the transmittance higher) and achieve preferable optical characteristics as a phase shift film.

Phase shift film 3 may be formed from a material made of silicon and nitrogen, or a material containing, in addition to the material made of silicon and nitrogen, one or more elements selected from among semimetal elements, non-metal elements, and rare gases (hereinafter, collectively referred to as a "silicon based material"). This phase shift film 3 of a silicon based material contains no transition metal, which can serve as a factor decreasing light fastness with respect to ArF exposure light. Furthermore, metal elements other than transition metals are not allowed to be contained either, because there is no ruling out the possibility that they might serve as a factor decreasing light fastness with respect to the ArF exposure light. Phase shift film 3 of a silicon based material may contain any semimetal element. Among these semimetal elements, it is preferable to have phase shift film 3 contain one or more elements selected from among boron, germanium, antimony, and tellurium since it is expected to increase the conductivity of silicon used as the target when forming phase shift film 3 by the sputtering method.

Phase shift film 3 of a silicon based material may incorporate rare gases, such as helium (He), neon (Ne), argon (Ar), krypton (Kr), and xenon (Xe). Phase shift film 3 of a silicon based material preferably restricts the oxygen content to 10 atom % or less, more preferably 5 atom % or less, and even more preferably does not intentionally incorporate oxygen (at the lowest detection limit or less as determined by composition analysis using X-ray photoelectron spectroscopy). This is because if a silicon based material incorporates oxygen, the extinction coefficient k tends to decrease greatly, with the overall thickness of phase shift film 3 becoming thicker.

Phase shift film 3 of a silicon based material may be configured as a single layer or as a laminate of multiple layers, except for the front layer (oxidation layer) in which oxidation cannot be avoided. It is possible to form phase shift film 3 as a single layer of a silicon based material (including the front layer that is an oxidation layer), having such optical characteristics so as to transmit at a predetermined transmittance and produce a predetermined phase difference with respect to the ArF exposure light. However, when forming phase shift film 3 of a material having such optical characteristics by the sputtering method, the film forming conditions can be such that it is difficult to stably form films with highly uniform optical characteristics or films with low defects depending on the type of sputtering method. In light of these matters, phase shift film 3 of a silicon based material may be structured as a laminate of a low transmittance layer with a relatively low nitrogen content and a high transmittance layer with a relatively high nitrogen content. In this case, the low transmittance layer is preferably a nitride film of a silicon based material formed by metal mode sputtering while the high transmittance layer is preferably a nitride film of a silicon based material formed by reactive mode (poison mode) sputtering. In this way, phase shift film 3 can be formed that satisfies the desired transmittance conditions and the desired phase difference conditions without using transition mode sputtering, whose film forming conditions are difficult to determine.

The low transmittance layer and the high transmittance layer in phase shift film 3 of a silicon based material are preferably in direct contact with each other to form a laminate structure without any other film interposed therebetween. Furthermore, a film structure in which neither the low transmittance layer nor the high transmittance layer is in contact with a film made of a material containing a metal element is preferred. This is because if heating treatment or irradiation of the ArF exposure light is performed with a silicon containing layer in contact with a film containing a metal element, the metal element is prone to diffuse into the silicon containing layer.

The low transmittance layer and the high transmittance layer in phase shift film 3 of a silicon based material preferably is made of the same constituent elements. In a case where either the low transmittance layer or the high transmittance layer contains a different constituent element and heating treatment or irradiation of the ArF exposure light is performed with these layers in contact with each other, the different constituent element may travel and diffuse into the layer that does not contain the constituent element. Then, the optical characteristics of the low transmittance layer and the high transmittance layer may change greatly from the initial film formation. In phase shift film 3, the order of lamination of the low transmittance layer and the high transmittance layer from the etching stopper film 2 side may be either way.

Phase shift film 3 of a silicon based material preferably has two or more sets of laminated structures made of one low transmittance layer and one high transmittance layer. Furthermore, each layer of the low transmittance layers and the high transmittance layers preferably has a thickness of 20 nm or less. The low transmittance layer and the high transmittance layer greatly differ in terms of required optical characteristics, so the difference between both in terms of nitrogen content in the layer is large. For this reason, the low transmittance layer and the high transmittance layer greatly differ in terms of etching rate in dry etching with a fluorine based gas. If the phase shift film has a two layer structure made of one low transmittance layer and one high transmittance layer, when forming patterns by dry etching with a fluorine based gas, level differences are prone to be generated in the cross section of the phase shift film pattern after etching. By making phase shift film 3 as a structure having two or more sets of laminated structures made of one low transmittance layer and one high transmittance layer, it is possible to reduce level differences caused in the cross section of the phase shift film pattern after etching because the thickness of each layer (one layer) of the low transmittance layers and the high transmittance layers become thinner compared to that in the case of the abovementioned two layer structure (one set of laminated structure). Furthermore, by restricting the thickness of each layer (one layer) of the low transmittance layers and the high transmittance layers to 20 nm or less, it is possible to further inhibit level differences caused in the cross section of the phase shift film pattern after etching. Furthermore, by restricting the thickness of each layer of the low transmittance layers and the high transmittance layers to 20 nm or less, it is possible to further inhibit the low transmittance layer from being etched with a fluorine based gas in a non-excited state such as $XeF_2$ when carrying out EB defect repair.

Phase shift film 3 of a silicon based material has an uppermost layer formed from a material made of silicon, nitrogen, and oxygen or a material containing, in addition to the above material, one or more elements selected from among semimetal elements, non-metal elements, and rare gases at the farthest position from transparent substrate 1. The uppermost layer formed from a material made of silicon, nitrogen, and oxygen or a material containing, in addition to the above material, one or more elements selected from among semimetal elements, non-metal elements, and rare gases includes, in addition to a configuration having substantially the same composition in the layer thickness direction, a configuration having a gradient composition in the layer thickness direction (a configuration having a gradient composition in which the oxygen content increases as the uppermost layer goes away from transparent substrate 1). Suitable materials for the uppermost layer configured to have substantially the same composition in the layer thickness direction include $SiO_2$ and SiON. The uppermost layer configured to have a gradient composition in the layer thickness direction is preferably configured such that the transparent substrate 1 side is SiN, the oxygen content increases going away from transparent substrate 1, and the front layer is $SiO_2$ or SiON.

The low transmittance layer, high transmittance layer, and uppermost layer of phase shift film 3 of a silicon based material are formed by sputtering, with any sputtering being applicable, such as DC sputtering, RF sputtering, and ion beam sputtering. When using targets with low conductivity (such as silicon targets, silicon compound targets with no or little semimetal element content), application of RF sputtering or ion beam sputtering is preferred, with RF sputtering being more preferred taking the film forming rate into consideration.

Detection of etching endpoints in EB defect repair is performed by detecting at least any one of Auger electrons, secondary electrons, characteristic X-rays, and backscattered electrons discharged from irradiated portions when black defects are irradiated with an electron beam. For example, to detect Auger electrons discharged from portions irradiated with an electron beam, changes in material composition are mainly checked by Auger electron spectroscopy (AES). Furthermore, to detect secondary electrons, changes in surface shape are mainly checked from SEM images. In addition, to detect characteristic X-rays, changes in material composition are mainly checked by energy dispersive X-ray spectroscopy (EDX) or wavelength dispersive X-ray spectroscopy (WDX). To detect backscattered electrons, changes in material composition or crystal state are checked by electron backscatter diffraction (EBSD).

In a mask blank configured with phase shift film (both single-layer film and multilayer film) 3 of a silicon based material provided in contact with the main surface of transparent substrate 1 made of a glass material, silicon and nitrogen account for most of the components of phase shift film 3, while silicon and oxygen account for most of the components of transparent substrate 1, with the only differences between them substantially lying in oxygen and nitrogen. For this reason, this combination made it difficult to detect etching corrections in EB defect repair. In contrast, in a configuration having phase shift film 3 provided in contact with the surface of etching stopper film 2, silicon and nitrogen account for most of the components of phase shift film 3, while etching stopper film 2 includes aluminum, in addition to silicon and oxygen. For this reason, in etching corrections for EB defect repair, detection of aluminum alone can serve as a guide, making the detection of endpoints relatively easy.

On the one hand, phase shift film 3 can be formed from a material containing a transition metal, silicon, and nitrogen. In this case, the transition metal includes any one or more metals from among molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), zinc (Zn), niobium (Nb), and palladium (Pd), etc., and alloys thereof. The material for phase shift film 3 may include, in addition to the abovementioned elements, elements such as nitrogen (N), oxygen (O), carbon (C), hydrogen (H), and boron (B). Furthermore, materials for phase shift film 3 may include inert gases such as helium (He), argon (Ar), krypton (Kr), and xenon (Xe). Taking into consideration the detection of etching endpoints in EB defect repair, this phase shift film 3 preferably does not incorporate aluminum.

For phase shift film 3, the ratio calculated by dividing the transition metal (M) content [atom %] in the layer by the total content [atom %] of transition metal (M) and silicon (Si) (hereinafter, referred to as the ratio of M/[M+Si]) needs to be 0.15 or less. In this phase shift film 3, the etching rate of dry etching with a fluorine based gas containing no carbon (such as $SF_6$) becomes faster as the transition metal content increases, making it easier, though still not sufficient, to achieve etching selectivity in relation to transparent substrate 1. Furthermore, any ratio of M/[M+Si] in phase shift film 3 greater than this is not preferred as more oxygen must be contained to achieve the desired transmittance and the thickness of phase shift film 3 may become thicker.

There is also a technical problem in that if phase shift film 3 has a large content of transition metal, resistance to the irradiation of the ArF exposure light (ArF light fastness) decreases. This problem can be solved to a certain extent by surrounding the phase shift mask with air having as little moisture as possible (for example, a dry air environment) when placing the phase shift mask in the mask stage of the exposure apparatus for exposure transfer. However, there still exists a need for a phase shift mask that has high resistance to the irradiation of the ArF exposure light even when not in such an environment. Taking these points into consideration, the ratio of M/[M+Si] of phase shift film 3 is preferably less than 0.04. The ratio of M/[M+Si] in phase shift film 3 is more preferably 0.03 or less, and even more preferably 0.02 or less.

On the other hand, the ratio of M/[M+Si] in phase shift film 3 is preferably 0.01 or more. This is because phase shift film 3 preferably has a lower sheet resistance when, in the making of phase shift masks from mask blanks, defect repairs are applied to black defects present on the pattern of phase shift film 3 with electron beam irradiation and non-excited gases such as $XeF_2$.

Regarding light shielding film 4, either a single layer structure or a laminated structure of two or more layers may be applied. Furthermore, each layer of a light shielding film of the single layer structure and a light shielding film of the laminated structure of two or more layers may be configured to have substantially the same composition in the film thickness direction or layer thickness direction, or may be configured to have a gradient composition in the layer thickness direction.

Mask blank 100 illustrated in FIG. 1 is configured with light shielding film 4 laminated on phase shift film 3, with no other film interposed therebetween. In the case of light shielding film 4 of this configuration, to the etching gas to be used when forming patterns on phase shift film 3, a material with sufficient etching selectivity needs to be applied.

In this case, light shielding film 4 is preferably formed from a chromium containing material. Chromium containing materials for forming light shielding film 4 include, apart from chromium metals, materials containing one or more elements selected from among oxygen (O), nitrogen (N), carbon (C), boron (B), and fluorine (F) in addition to chromium (Cr). Generally, chromium based materials are etched by a mixed gas made up of a chlorine based gas and oxygen gas; however, chromium metals do not have a very high etching rate with respect to such an etching gas. With consideration to increasing the etching rate with respect to a mixed gas made up of a chlorine based gas and oxygen gas, the material for forming light shielding film 4 is preferably a material containing one or more elements selected from among oxygen, nitrogen, carbon, boron, and fluorine in addition to chromium. Furthermore, the chromium containing material for forming light shielding film 4 may incorporate one or more elements from among molybdenum (Mo), indium (In), and tin (Sn). By incorporating one or more elements from among molybdenum, indium, and tin, it is possible to make faster the etching rate with respect to a mixed gas made up of a chlorine based gas and oxygen gas.

Note that the mask blank of the present invention is not limited to the one illustrated in FIG. 1 and may be configured such that another film (etching mask/stopper film) is interposed between phase shift film 3 and light shielding film 4. In this case, a configuration in which the etching mask/stopper film is formed from the abovementioned chromium containing material and light shielding film 4 is formed from a silicon containing material is preferred.

The silicon containing material for forming light shielding film 4 may incorporate a transition metal or a metal element other than a transition metal. The pattern to be formed on light shielding film 4 is a light shielding band pattern in the outer periphery region as a rule. This is because the region has less cumulative irradiation of the ArF exposure light compared to the transfer pattern region and because a fine pattern is rarely arranged in this outer periphery region and low ArF resistance would cause substantially no problems. Furthermore, this is because having light shielding film 4 incorporate a transition metal greatly improves the light shielding performance compared to the case in which no transition metal is incorporated, making it possible to make the thickness of light shielding film 4 thinner. Transition metals to be incorporated in light shielding film 4 include any one metal such as molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), and palladium (Pd), or alloys thereof.

Upon completion of the phase shift mask, light shielding film 4 forms a light shielding band in a laminated structure together with phase shift film 3. For this reason, light shielding film 4 needs to ensure an optical density (OD) of more than 2.0, preferably an OD of 2.8 or more, and more preferably an OD of 3.0 or more in a laminated structure together with phase shift film 3.

In the present embodiment, hard mask film 5 laminated onto light shielding film 4 is formed from a material having etching selectivity with respect to the etching gas used when etching light shielding film 4. Thus, as described below, the thickness of the resist film can be made significantly thinner than when the resist film is directly used as a mask for light shielding film 4.

As described above, because light shielding film 4 needs to ensure a predetermined optical density and have sufficient light shielding function, there is a limit to the reduction in thickness thereof. On the one hand, hard mask film 5 only has to have such a film thickness so as to be able to function as an etching mask until the dry etching for forming a pattern on light shielding film 4 located directly underneath ends and is not subject to optical restrictions as a rule. For this reason, the thickness of hard mask film 5 can be made significantly thinner compared to the thickness of light shielding film 4. On the other hand, because the resist film of an organic material only has to have such a film thickness so as to be able to function as an etching mask until the dry etching for forming a pattern on this hard mask film 5 ends, the thickness of the resist film can be made significantly thinner than when the resist film is used as a direct mask onto light shielding film 4. Since the resist film can also be made thinner in this way, it is possible to enhance resist resolution and prevent the formed pattern from collapsing.

As described above, while hard mask film 5 laminated onto light shielding film 4 is preferably formed from the abovementioned material, the present invention is not limited to this embodiment. In mask blank 100, a resist pattern may be directly formed on light shielding film 4, without forming a hard mask film 5, and the etching of light shielding film 4 may be directly performed with the resist pattern serving as a mask.

This hard mask film 5 is preferably formed from the abovementioned silicon containing material in a case where light shielding film 4 is formed from a chromium containing material. Here, in this case, because hard mask film 5 tends to have low adhesion to resist films of organic materials, the surface of hard mask film 5 is preferably subjected to HMDS (Hexamethyldisilazane) treatment to enhance surface adhesion. Note that in this case, hard mask film 5 is more preferably formed from $SiO_2$, SiN, SiON, etc.

Furthermore, for the case in which light shielding film 4 is formed from a chromium containing material, tantalum containing materials may be applied as the material for hard mask film 5. In this case, tantalum containing materials include, apart from tantalum metals, materials incorporating one or more elements selected from among nitrogen, oxygen, boron, and carbon in addition to tantalum. Examples thereof include Ta, TaN, TaO, TaON, TaBN, TaBO, TaBON, TaCN, TaCO, TaCON, TaBCN, and TaBOCN. Note that in this case, the silicon content of hard mask film 5 is preferably 5 atom % or less, more preferably 3 atom % or less, and even more preferably it does not substantially contain silicon. Furthermore, hard mask film 5 is preferably formed from the abovementioned chromium containing material in the case where light shielding film 4 is formed from a silicon containing material.

In mask blank 100, a resist film of an organic material having a film thickness of 100 nm or less is preferably formed in contact with the surface of hard mask film 5. In the case of fine patterns supporting the hp 32 nm generation of DRAMs, an SRAF (Sub-Resolution Assist Feature) with a line width of 40 nm may be provided on a transfer pattern (phase shift pattern) to be formed on hard mask film 5. Even in a case such as this, the aspect ratio of the cross section of resist patterns is as low as 1:2.5, so resist patterns are inhibited from collapsing or separating during the development, rinsing, etc., of the resist film. Note that the film thickness of the resist film is more preferably 80 nm or less, as this will further inhibit resist patterns from being collapsed or separated.

Etching stopper film 2, phase shift film 3, light shielding film 4, and hard mask film 5 are formed by sputtering, with any sputtering being applicable, such as DC sputtering, RF sputtering, and ion beam sputtering. When using targets with low conductivity, RF sputtering or ion beam sputtering is preferably applied, with RF sputtering more preferable when taking the film forming rate into consideration.

Regarding the film forming method of etching stopper film 2, it is preferable to place a mixed target of silicon and oxygen and a mixed target of aluminum and oxygen in the film forming chamber, and form etching stopper film 2 on transparent substrate 1. Specifically, transparent substrate 1 is placed at the substrate stage within the film forming chamber and a predetermined voltage is applied to each of the two targets under an inert gas atmosphere such as argon gas (or a mixed gas atmosphere with oxygen gas or an oxygen containing gas) (in this case, an RF power supply is preferable). Thus, rare gas particles that have turned into plasma collide with the two targets to respectively generate a sputtering phenomenon, forming etching stopper film 2 containing silicon, aluminum, and oxygen on the surface of transparent substrate 1. Note that in this case, a $SiO_2$ target and $Al_2O_3$ target are more preferably applied as the two targets.

Additionally, etching stopper film 2 may be formed with only a mixed target of silicon, aluminum, and oxygen (preferably, a mixed target of $SiO_2$ and $Al_2O_3$; the same applies hereinafter), and two targets including a mixed target of silicon, aluminum, and oxygen and a silicon target, or including a mixed target of aluminum and oxygen and an aluminum target may be made to discharge electricity to form etching stopper film 2.

As stated above, the mask blank 100 of the first embodiment includes etching stopper film 2 containing silicon, aluminum, and oxygen between transparent substrate 1 and phase shift film 3, which is a thin film for pattern formation. Moreover, this etching stopper film 2 simultaneously satisfies the following three characteristics: higher durability than that of transparent substrate 1 to dry etching with a fluorine based gas, which is performed when forming a pattern on phase shift film 3; high resistance to chemical cleaning; and high transmittance with respect to exposure light. Thus, when forming a transfer pattern on phase shift film 3 by dry etching with a fluorine based gas, because over-etching can be performed without digging into the main surface of transparent substrate 1, the verticality of pattern side walls can be increased and the in-plane CD uniformity of the pattern can be increased. Furthermore, when correcting black defects in phase shift patterns discovered during the process of manufacturing phase shift masks by EB defect repair, black defects can be accurately corrected because etching endpoints are easy to detect.

[Phase Shift Mask and the Manufacture Thereof]

This phase shift mask 200 according to the first embodiment (see FIG. 2) is featured in that etching stopper film 2 of mask blank 100 remains across the entire surface of the main surface of transparent substrate 1, a transfer pattern (phase shift pattern 3a) is formed on phase shift film 3, and a pattern including a light shielding band (light shielding pattern 4b: a light shielding band, light shielding patch, etc.) is formed on light shielding film 4. In the case of the configuration in which hard mask film 5 is provided on mask blank 100, hard mask film 5 is removed during the process of making this phase shift mask 200.

In other words, this phase shift mask 200 according to the first embodiment is featured in that phase shift pattern 3a, which is a phase shift film having a transfer pattern, is provided on the main surface of transparent substrate 1, light shielding pattern 4b, which is a light shielding film including a light shielding band, is provided on phase shift pattern 3a, etching stopper film 2 is provided between transparent substrate 1 and phase shift pattern 3a, phase shift pattern 3a contains silicon, and etching stopper film 2 contains silicon, aluminum, and oxygen.

The method of manufacturing this phase shift mask according to the first embodiment uses the abovementioned mask blank 100 and includes the steps of: forming a transfer pattern on light shielding film 4 by dry etching, forming a transfer pattern on phase shift film 3 by dry etching with a fluorine based gas with light shielding film 4 having the transfer pattern serving as a mask, and forming a pattern including a light shielding band (a light shielding band, light shielding patch, etc.) on light shielding film 4 by dry etching.

Hereinafter, the method of manufacturing this phase shift mask 200 according to the first embodiment will be described following the manufacturing steps illustrated in FIG. 3. Note that the method of manufacturing phase shift mask 200 that uses mask blank 100, in which hard mask film 5 is laminated onto light shielding film 4, will be described here. Furthermore, the case in which a chromium containing material is applied to light shielding film 4 and a silicon containing material is applied to hard mask film 5 will be described.

First, in mask blank 100, a resist film is formed in contact with hard mask film 5 by the spin coating method. Next, with respect to the resist film, a first pattern which is a transfer pattern (phase shift pattern) to be formed on phase shift film 3 is drawn by an electron beam and predetermined treatments such as development processing are performed to form first resist pattern 6a having a phase shift pattern (see FIG. 3A). Subsequently, dry etching with a fluorine based gas is performed, with first resist pattern 6a serving as a mask, to form the first pattern (hard mask pattern 5a) on hard mask film 5 (see FIG. 3B).

Figure 3A:
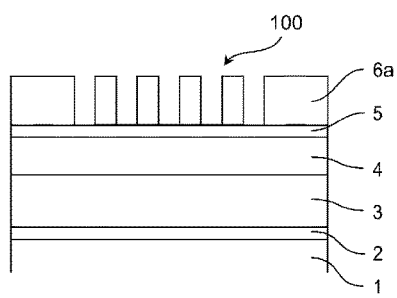
FIGS. 3A to 3F are schematic cross-sectional drawings illustrating the manufacturing steps for a phase shift mask according to the first embodiment of the present invention.
Figure 3D:
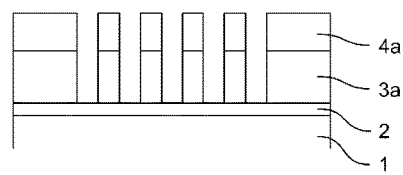
Figure 3B:
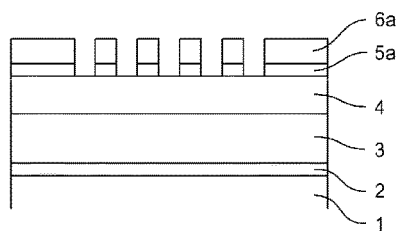
Figure 3E:
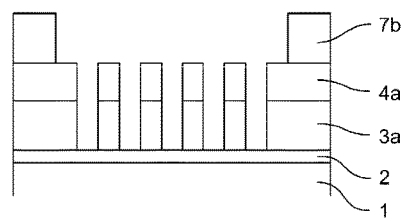
Figure 3C:
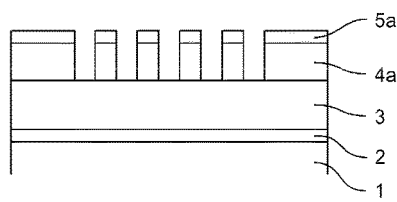
Figure 3F:
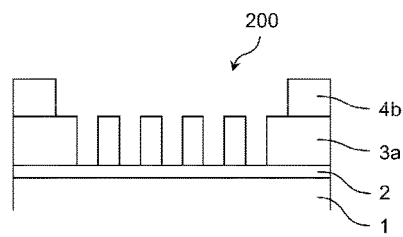

Next, after removing resist pattern 6a, dry etching with a mixed gas made up of a chlorine based gas and oxygen gas is performed, with hard mask pattern 5a serving as a mask, to form the first pattern (light shielding pattern 4a) on light shielding film 4 (see FIG. 3C). Subsequently, dry etching with a fluorine based gas is performed, with light shielding pattern 4a serving as a mask, to form the first pattern (phase shift pattern 3a) on phase shift film 3 and simultaneously remove hard mask pattern 5a (see FIG. 3D).

During dry etching of this phase shift film 3 with a fluorine based gas, additional etching (over-etching) is performed to increase the verticality of the pattern side walls of phase shift pattern 3a and increase the in-plane CD uniformity of phase shift pattern 3a. Even after such over-etching, the surface of etching stopper film 2 is only minutely etched, with the surface of transparent substrate 1 not exposed at light transmissive portions of phase shift pattern 3a.

Next, a resist film is formed on mask blank 100 by the spin coating method. Then, with respect to the resist film, a second pattern which is a pattern (light shielding pattern) to be formed on light shielding film 4 is drawn by an electron beam and predetermined treatments such as development processing are performed to form second resist pattern 7b having a light shielding pattern (see FIG. 3E). Here, the second pattern may be an exposure drawing by the laser light of a high throughput laser drawing apparatus instead of a drawing by an electron beam because the second pattern is a relatively large pattern.

Subsequently, dry etching with a mixed gas made up of a chlorine based gas and oxygen gas was performed, with second resist pattern 7b serving as a mask, to form the second pattern (light shielding pattern 4b) on light shielding film 4. In addition, second resist pattern 7b is removed and predetermined treatments such as cleaning are followed to obtain phase shift mask 200 (see FIG. 3F). Although ammonia-hydrogen peroxide was used in the cleaning step, the surface of etching stopper film 2 was scarcely dissolved, with the surface of transparent substrate 1 not exposed at light transmissive portions of phase shift pattern 3a.

The abovementioned chlorine based gas used in dry etching is not particularly limited as long as it contains chlorine (Cl). Examples thereof include $Cl_2$, $SiCl_2$, $CHCl_3$, $CH_2Cl_2$, and $BCl_3$. Furthermore, because mask blank 100 includes etching stopper film 2 on transparent substrate 1, the abovementioned fluorine based gas used in dry etching is not particularly limited as long as it contains fluorine (F). Examples thereof include $CHF_3$, $CF_4$, $C_2F_6$, $C_4F_8$, and $SF_6$.

This phase shift mask 200 of the first embodiment is made using the abovementioned mask blank 100. Etching stopper film 2 simultaneously satisfies the following three characteristics: higher resistance than that of a transparent substrate to dry etching with a fluorine based gas, which is performed when forming a pattern on phase shift film 3; high resistance to chemical cleaning; and high transmittance with respect to exposure light. Thus, when forming phase shift pattern (transfer pattern) 3a on phase shift film 3 by dry etching with a fluorine based gas, over-etching can be performed without digging into the main surface of transparent substrate 1. For this reason, in this phase shift mask 200 of the first embodiment, the side walls of phase shift pattern 3a have high verticality and phase shift pattern 3a also has high in-plane CD uniformity. Furthermore, when black defects are discovered in phase shift pattern 3a during the process of manufacturing phase shift mask 200 and the black defects are corrected by EB defect repair, black defects can be accurately corrected because etching endpoints are easy to detect.

[Manufacture of Semiconductor Device]

The method of manufacturing a semiconductor device of the first embodiment is featured in that transfer patterns is transferred by exposure to resist films on semiconductor substrates by using phase shift mask 200 of the first embodiment or phase shift mask 200 manufactured using mask blank 100 of the first embodiment. In phase shift mask 200 of the first embodiment, the side walls of phase shift pattern 3a have high verticality and phase shift pattern 3a also has high in-plane CD uniformity. For this reason, transferring by exposure to resist films on semiconductor devices using phase shift mask 200 of the first embodiment allows patterns to be formed on the resist films of the semiconductor devices with a degree of accuracy sufficient to satisfy design specifications.

Furthermore, even when exposure transfer to resist films of semiconductor devices is carried out using phase shift masks whose black defect portions have been corrected by EB defect repair during the process of manufacturing, the black defects are corrected with high accuracy and the occurrence of transfer failure can be prevented in the resist films of the semiconductor devices corresponding to the pattern areas in which the black defects of the phase shift masks existed. For this reason, if circuit patterns are formed using these resist patterns as a mask to dry etch the film to be processed, circuit patterns can be formed with high accuracy and high yield without shortcuts and disconnection of wires due to insufficient accuracy or transfer defects.

Second Embodiment

[Mask Blank and the Manufacture Thereof]

Figure 4:
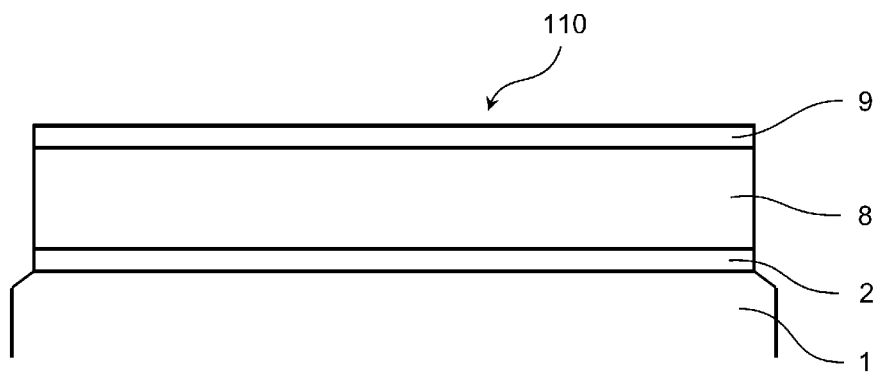
FIG. 4 is a cross-sectional drawing illustrating a configuration of a mask blank according to a second embodiment of the present invention.

The mask blank according to the second embodiment of the present invention is used to manufacture a binary mask (transfer mask), Levenson phase shift mask (transfer mask), or CPL (Chromeless Phase Lithography) mask (transfer mask), with the thin film for pattern formation serving as a light shielding film having a predetermined optical density. FIG. 4 illustrates a configuration of the mask blank of this second embodiment. The mask blank 110 of this second embodiment has a structure in which etching stopper film 2, light shielding film (thin film for pattern formation) 8 and hard mask film 9 are sequentially laminated on transparent substrate 1. Note that for configurations similar to those of the mask blank of the first embodiment, a description is omitted here.

Light shielding film 8 is a thin film for pattern formation onto which a transfer pattern is formed when a binary mask is manufactured from a mask blank. Binary masks are required to have high light shielding performance with respect to patterns of light shielding film 8. Regarding light shielding film 8 alone, an OD with respect to exposure light of 2.8 is required, with an OD of 3.0 preferred. Regarding light shielding film 8, either of a single layer structure and a laminated structure of two or more layers may be applied. Furthermore, each layer of a light shielding film of the single layer structure and a light shielding film of the laminated structure of two or more layers may be configured to have substantially the same composition in the film thickness direction or layer thickness direction, or may be configured to have a gradient composition in the layer thickness direction.

Light shielding film 8 is formed from a material onto which a transfer pattern may be patterned by dry etching with a fluorine based gas. Materials having such characteristics include, in addition to silicon containing materials, materials containing a transition metal and silicon. Materials containing a transition metal or silicon have high light shielding performance compared to materials containing no transition metals, making it possible to make the thickness of light shielding film 8 thinner. The transition metal to be contained in light shielding film 8 includes any one of metals from among molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), and palladium (Pd), etc., and alloys thereof. Taking into consideration the detection of etching endpoints in EB defect repair, this light shielding film 8 preferably does not incorporate aluminum.

When forming light shielding film 8 from a silicon containing material, a metal other than the transition metals (such as tin (Sn), indium (In), and gallium (Ga)) may be incorporated. However, if a silicon containing material incorporates aluminum, etching selectivity in relation to etching stopper film 2 in dry etching with a fluorine based gas may decrease and etching endpoints may become difficult to detect if EB defect repair has been performed to light shielding film 8.

Light shielding film 8 may be formed from a material made of silicon and nitrogen or a material containing, in addition to the material made of silicon and nitrogen, one or more elements selected from among semimetal elements, non-metal elements, and rare gases. In this case, light shielding film 8 may contain any semimetal element. Among these semimetal elements, it is preferable to have light shielding film 8 contain one or more elements selected from boron, germanium, antimony, and tellurium since it is expected to increase the conductivity of silicon used as target when forming light shielding film 8 by the sputtering method.

In a case where light shielding film 8 has a laminated structure including the lower layer and upper layer, the lower layer may be formed from a material made of silicon or a material made of silicon and one or more elements selected from among carbon, boron, germanium, antimony, and tellurium, while the upper layer may be formed from a material made of silicon and nitrogen or a material containing, in addition to the material made of silicon and nitrogen, one or more elements selected from among semimetal elements, non-metal elements, and rare gases.

Light shielding film 8 may be formed from a material containing tantalum. In this case, the silicon content of light shielding film 8 is preferably 5 atom % or less, more preferably 3 atom % or less, and even more preferably it does not substantially contain silicon. These materials containing tantalum are materials onto which a transfer pattern may be patterned by dry etching with a fluorine based gas. In this case, materials containing tantalum include, apart from tantalum metals, materials incorporating one or more elements selected from among nitrogen, oxygen, boron, and carbon in addition to tantalum. Examples thereof include Ta, TaN, TaO, TaON, TaBN, TaBO, TaBON, TaCN, TaCO, TaCON, TaBCN, and TaBOCN.

Materials for forming light shielding film 8 may incorporate one or more elements selected from among oxygen, nitrogen, carbon, boron, and hydrogen as long as the optical density does not significantly decrease. To reduce the reflectance with respect to exposure light on a surface of light shielding film 8 on the opposite side of transparent substrate 1, the front layer on the opposite side of transparent substrate 1 (the upper layer in the case of a two layer structure having a lower layer and upper layer) may incorporate a large amount of oxygen and nitrogen.

The mask blank of the second embodiment also includes mask film 9 on light shielding film 8. This hard mask film 9 needs to be formed from a material having etching selectivity with respect to the etching gas used when etching light shielding film 8. Thus, the thickness of the resist film can be made significantly thinner than when the resist film is directly used as a mask for light shielding film 8.

As described above, because light shielding film 8 needs to ensure a predetermined optical density and have sufficient light shielding function, there is a limit to the reduction in thickness thereof. On the one hand, hard mask film 9 only has to have such a film thickness so as to be able to function as an etching mask until the dry etching for forming a pattern on light shielding film 8 located directly underneath ends and is not subject to optical restrictions as a rule. For this reason, the thickness of hard mask film 9 can be made significantly thinner compared to the thickness of light shielding film 8. On the other hand, because the resist film of an organic material only has to have such a film thickness so as to be able to function as an etching mask until the dry etching for forming a pattern on this hard mask film 9 ends, the thickness of the resist film can be made significantly thinner than when the resist film is used as a direct mask onto light shielding film 8. Since the resist film can also be made thinner in this way, it is possible to enhance resist resolution and prevent the formed pattern from collapsing.

This hard mask film 9 is preferably formed from a chromium containing material. Furthermore, hard mask film 9 is more preferably formed from a material containing, in addition to chromium, one or more elements selected from among nitrogen, oxygen, carbon, hydrogen, and boron. Hard mask film 9 may be formed from a material containing, in addition to these chromium containing materials, at least one or more metal elements selected from among indium (In), tin (Sn), and molybdenum (Mo) (hereinafter, referred to as "metal elements such as indium").

In this mask blank 110, a resist film of an organic material having a film thickness of 100 nm or less is preferably formed in contact with the surface of hard mask film 9. In the case of fine patterns supporting the hp 32 nm generation of DRAMs, an SRAF (Sub-Resolution Assist Feature) with a line width of 40 nm may be provided on a transfer pattern (phase shift pattern) to be formed on hard mask film 9. Even in a case such as this, the aspect ratio of the cross section of resist patterns is as low as 1:2.5, so resist patterns are inhibited from collapsing or separating during the development, rinsing, etc., of the resist film. Note that the film thickness of the resist film is more preferably 80 nm or less, as this will further inhibit resist patterns from being collapsed or separated.

As stated above, the mask blank 110 of the second embodiment includes etching stopper film 2 containing silicon, aluminum, and oxygen between transparent substrate 1 and light shielding film 8, which is a thin film for pattern formation. Moreover, this etching stopper film 2 simultaneously satisfies the following three characteristics: higher resistance than that of a transparent substrate 1 to dry etching with a fluorine based gas, which is performed when forming a pattern on light shielding film 8; high resistance to chemical cleaning; and high transmittance with respect to exposure light. Thus, when forming a transfer pattern on light shielding film 8 by dry etching with a fluorine based gas, because over-etching can be performed without digging into the main surface of transparent substrate 1, the verticality of pattern side walls can be increased and the in-plane CD uniformity of the pattern can be increased. Furthermore, when correcting black defects in light shielding patterns discovered during the process of manufacturing transfer masks (binary masks) by EB defect repair, black defects can be accurately corrected because etching endpoints are easy to detect.

[Transfer Mask and the Manufacture Thereof]

Figure 5:
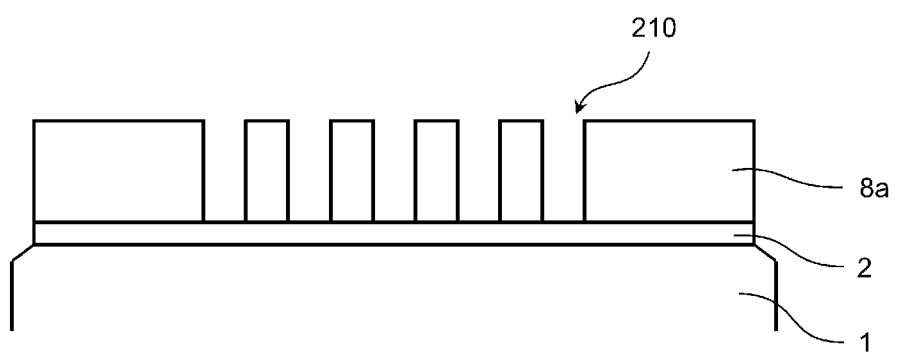
FIG. 5 is a cross-sectional drawing illustrating a configuration of a transfer mask according to the second embodiment of the present invention.

This transfer mask 210 according to the second embodiment (see FIG. 5) is featured in that etching stopper film 2 of mask blank 110 remains across the entire surface of the main surface of transparent substrate 1 and a transfer pattern (light shielding pattern 8a) is formed on light shielding film 8. In the case of the configuration in which hard mask film 9 is provided on mask blank 110, hard mask film 9 is removed during the process of making this transfer mask 210.

In other words, this transfer mask 210 according to the second embodiment is featured in that light shielding pattern 8a, which is a light shielding film having a transfer pattern, is provided on the main surface of transparent substrate 1, etching stopper film 2 is provided between transparent substrate 1 and light shielding pattern 8a, light shielding pattern 8a contains silicon, and etching stopper film 2 contains silicon, aluminum, and oxygen.

The method of manufacturing this transfer mask (binary mask) according to the second embodiment is featured in that the method uses the abovementioned mask blank 110 and includes a step for forming a transfer pattern on light shielding film 8 by dry etching with a fluorine based gas. Hereinafter, the method of manufacturing this transfer mask 210 according to the second embodiment will be described following the manufacturing steps illustrated in FIGS. 6a to 6D. Note that the method of manufacturing transfer mask 210 that uses mask blank 110 in which hard mask film 9 is laminated onto light shielding film 8 will be described here. Furthermore, the case in which a material containing a transition metal and chromium is applied to light shielding film 8 and a chromium containing material is applied to hard mask film 9 will be described.

First, in mask blank 110, a resist film is formed in contact with hard mask film 9 by the spin coating method. Next, with respect to the resist film, a transfer pattern (light shielding pattern) to be formed on light shielding film 8 is drawn by an electron beam and predetermined treatments such as development processing are performed to form resist pattern 10a having a light shielding pattern (see FIG. 6A).

Subsequently, dry etching with a mixed gas made up of a chlorine based gas and oxygen gas is performed, with resist pattern 10a serving as a mask, to form a transfer pattern (hard mask pattern 9a) on hard mask film 9 (see FIG. 6B).

Figure 6A:
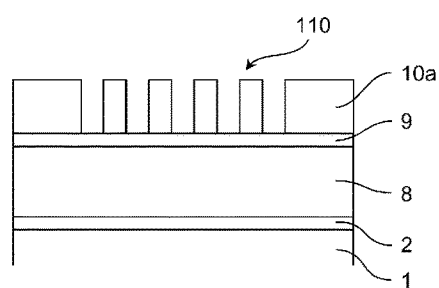
FIGS. 6A to 6D are schematic cross-sectional drawings illustrating the manufacturing steps for a transfer mask according to the second embodiment of the present invention.
Figure 6C:
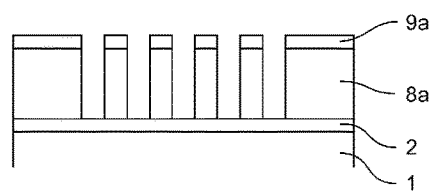

Next, after removing resist pattern 10a, with hard mask pattern 9a serving as a mask, dry etching with fluorine gas is performed to form a transfer pattern (light shielding pattern 8a) on light shielding film 8 (see FIG. 6C). During dry etching of this light shielding film 8 with a fluorine based gas, additional etching (over-etching) is performed to increase the verticality of the pattern side walls of light shielding pattern 8a and increase the in-plane CD uniformity of light shielding pattern 8a. Even after such over-etching, the surface of etching stopper film 2 is only minutely etched, with the surface of transparent substrate 1 not exposed even at light transmissive portions of light shielding pattern 8a.

Figure 6B:
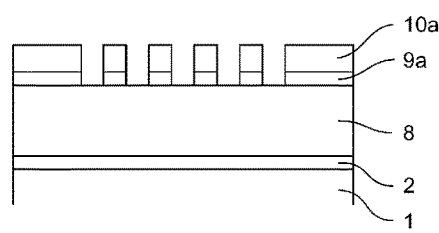
Figure 6D:
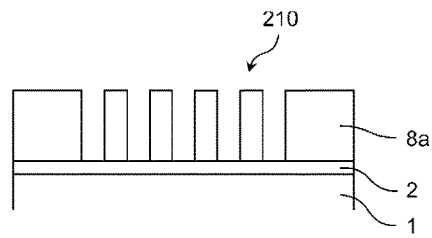

In addition, the remaining hard mask pattern 9a was removed by dry etching with a mixed gas made up of a chlorine based gas and oxygen gas and predetermined treatments such as cleaning were followed to obtain transfer mask 210 (see FIG. 6D). Although ammonia-hydrogen peroxide was used in the cleaning step, the surface of etching stopper film 2 was scarcely dissolved, with the surface of transparent substrate 1 not exposed at light transmissive portions of light shielding pattern 8a. Note that the abovementioned chlorine based gas and fluorine based gas used in dry etching are the same as those used the first embodiment.

This transfer mask 210 of the second embodiment was made using the abovementioned mask blank 110. Etching stopper film 2 simultaneously satisfies the following three characteristics: higher resistance than that of a transparent substrate to dry etching with a fluorine based gas, which is performed when forming a pattern on phase light shielding film 8; high resistance to chemical cleaning; and high transmittance with respect to exposure light. Thus, when forming light shielding pattern (transfer pattern) 8a on light shielding film 8 by dry etching with a fluorine based gas, over-etching can be performed without digging into the main surface of transparent substrate 1. For this reason, in this transfer mask 210 of the second embodiment, the side walls of light shielding pattern 8a have high verticality and light shielding pattern 8a also has high in-plane CD uniformity. Furthermore, when black defects are discovered in light shielding pattern 8a during the process of manufacturing transfer mask 210 and the black defects are corrected by EB defect repair, black defects can be accurately corrected because etching endpoints are easy to detect.

[Manufacture of Semiconductor Device]

The method of manufacturing a semiconductor device of the second embodiment is featured in that transfer mask 210 of the second embodiment or transfer mask 210 manufactured using mask blank 110 of the second embodiment is used to transfer by exposure transfer patterns to resist films on semiconductor substrates. In transfer mask 200 of the second embodiment, the side walls of light shielding pattern 8a have high verticality and light shielding pattern 8a also has high in-plane CD uniformity. For this reason, exposure transfer to resist films on semiconductor devices using transfer mask 210 of the second embodiment allows patterns to be formed on the resist films of the semiconductor devices with a degree of accuracy sufficient to satisfy design specifications.

EXAMPLES

Hereinafter, embodiments of the present invention will be described more specifically by way of examples.

Example 1

[Manufacture of Mask Blank]

Transparent substrate 1 was prepared having main surface dimensions of approximately 152 mm×approximately 152 mm and made of a synthetic quartz glass with a thickness of approximately 6.35 mm. This transparent substrate 1 had been polished to a predetermined surface roughness or less (a root mean square roughness Rq of 0.2 nm or less) at the end surfaces and the main surface, then subjected to a predetermined cleaning treatment and drying treatment.

Next, etching stopper film 2 (AlSiO film) made of aluminum, silicon, and oxygen was formed to a thickness of 10 nm in contact with the surface of transparent substrate 1. Specifically, transparent substrate 1 was installed in a single-wafer RF sputtering device and etching stopper film 2 was formed by a sputtering (RF sputtering) that made an $Al_2O_3$ target and $SiO_2$ target simultaneously discharge with argon (Ar) gas serving as the sputtering gas. X-ray photoelectron spectroscopy analysis of an etching stopper film formed on another transparent substrate under the same conditions found that Al:Si:O=21:19:60 (atom % ratio). In other words, Si/[Si+Al] for this etching stopper film 2 is 0.475. Note that in the X-ray photoelectron spectroscopy analysis, numerical values have been adjusted based on the results of RBS analysis (analysis by Rutherford backscattering spectrometry) (the same applies to the analyses below). Furthermore, measurement of the respective optical characteristics of this etching stopper film using a spectral ellipsometer (M-2000D manufactured by J. A. Woollam) found a refractive index n of 1.625 along with an extinction coefficient k of 0.000 (measurement lower limit) with respect to light having a wavelength of 193 nm.

Next, phase shift film (MoSiN film) 3 made of molybdenum, silicon, and nitrogen was formed to a thickness of 64 nm in contact with the surface of etching stopper film 2. Specifically, transparent substrate 1 on which etching stopper film 2 had been formed was installed in a single-wafer DC sputtering device and phase shift film 3 was formed by reactive sputtering (DC sputtering) in which a mixed sintered target of molybdenum (Mo) and silicon (Si) was used (Mo:Si=12:88 (atom % ratio)) and a mixed gas made up of argon (Ar), nitrogen ($N_2$), and helium (He) (flow ratio Ar:$N_2$:He=8:72:100, pressure=0.2 Pa) served as the sputtering gas. X-ray photoelectron spectroscopy analysis of a phase shift film formed on another transparent substrate under the same conditions found that Mo:Si:N=4.1:35.6:60.3 (atom % ratio).

Heating treatment in the atmosphere was performed with respect to transparent substrate 1 on which phase shift film 3 had been formed. This heating treatment was performed for 30 minutes at 450° C. With respect to this heat treated phase shift film 3, measurement of transmittance in the wavelength of the ArF excimer laser (193 nm) and phase shift amount using phase shift measurement system MPM193 (manufactured by Lasertec Corporation) found a transmittance of 7.35% and a phase shift amount of 162 degrees.

Furthermore, with respect to a heat treated phase shift film formed on another transparent substrate under the same conditions, measurement of the respective optical characteristics of the phase shift film using a spectral ellipsometer (M-2000D manufactured by J. A. Woollam) found a refractive index n of 2.415 along with an extinction coefficient k of 0.596 with respect to light having a wavelength of 193 nm.

Next, light shielding film (CrOCN film) 4 made of chromium, oxygen, carbon, and nitrogen was formed to a thickness of 46 nm in contact with the surface of phase shift film 3. Specifically, heat treated transparent substrate 1 was installed in a single-wafer DC sputtering device and light shielding film 4 was formed by reactive sputtering (DC sputtering) in which a chromium (Cr) target was used and argon (Ar), carbon dioxide ($CO_2$), nitrogen ($N_2$), and helium (He) serve as a sputtering gas. X-ray photoelectron spectroscopy analysis of a light shielding film formed on another transparent substrate under the same conditions found that Cr:O:C:N=55.2:22.1:11.6:11.1 (atom % ratio). Note that in a laminated structure of phase shift film 3 and light shielding film 4, the optical density at the wavelength of the ArF excimer laser (193 nm) was 2.8 or more.

Next, a hard mask film (SiON film) 5 made of silicon, oxygen, and nitrogen was formed to a thickness of 5 nm in contact with light shielding film 4. Specifically, transparent substrate 1 on which light shielding film 4 had been formed was installed in a single-wafer DC sputtering device and hard mask film 5 was formed by reactive sputtering in which a silicon (Si) target was used and a mixed gas made up of argon (Ar), nitric oxide (NO), and helium (He) (flow ratio Ar:NO:He=8:29:32, pressure=0.3 Pa) served as the sputtering gas. X-ray photoelectron spectroscopy analysis of a hard mask film formed on another transparent substrate under the same conditions found that Si:O:N=37:44:19 (atom % ratio). A mask blank of Example 1 was manufactured by the above procedures.

Note that measurement of the transmittance of an etching stopper film formed on another transparent substrate in the wavelength of the ArF excimer laser (193 nm) by the abovementioned phase shift measurement system found a transmittance of 98.3% assuming the transmittance of the transparent substrate is 100%, with the influence of the decrease in transmittance caused by the provision of this etching stopper film of Example 1 found to be small. Furthermore, the transparent substrate on which an etching stopper film had been formed was immersed in ammonia water having a concentration of 0.5% to measure the etching rate, which was 0.1 nm/min. These results confirmed that the etching stopper film 2 of this Example 1 has sufficient resistance to chemical cleaning performed during the process of manufacturing phase shift masks from mask blanks.

With respect to each of another transparent substrate, an etching stopper film formed on the other transparent substrate, and a phase shift film formed on the other transparent substrate, dry etching was performed under the same conditions using a mixed gas made up of $SF_6$ and He as the etching gas. Subsequently, the respective etching rates were calculated and the etching selection ratio between the three was calculated. The etching selection ratio of the etching stopper film of Example 1 to the etching rate of the transparent substrate was 0.1. The etching selection ratio of the phase shift film of Example 1 to the etching rate of the transparent substrate was 2.38. The etching selection ratio of the phase shift film of Example 1 to the etching rate of the etching stopper film of Example 1 was 23.8.

[Manufacture of Phase Shift Mask]

Next, phase shift mask 200 of Example 1 was made by the procedures below using the mask blank 100 of this Example 1. First, the surface of hard mask film 5 was subjected to HMDS treatment. Subsequently, a resist film made of a chemically amplified resist for electron beam lithography was formed to a film thickness of 80 nm in contact with the surface of hard mask film 5 by the spin coating method. Next, with respect to this resist film, a first pattern which was the phase shift pattern to be formed on phase shift film 3 was drawn by an electron beam and predetermined development processing was performed to form first resist pattern 6a having the first pattern (see FIG. 3A). Note that in the first pattern drawn by an electron beam at this time, programmed defects had been added other than the phase shift pattern to be rightfully formed such that black defects were formed on the phase shift film.

Next, with first resist pattern 6a serving as a mask, dry etching with a $CF_4$ gas was performed to form the first pattern (hard mask pattern 5a) on hard mask film 5 (see FIG. 3B).

Next, first resist pattern 6a was removed by TMAH. Subsequently, with hard mask pattern 5a serving as a mask, dry etching with a mixed gas made up of chlorine and oxygen (gas flow ratio $Cl_2:O_2$=4:1) was performed to form a first pattern (light shielding pattern 4a) on light shielding film 4 (see FIG. 3C).

Next, with light shielding pattern 4a serving as a mask, dry etching with a fluorine based gas ($SF_6$+He) was performed to form the first pattern (phase shift pattern 3a) on phase shift film 3 and simultaneously remove hard mask pattern 5a (see FIG. 3D). In this dry etching with a fluorine based gas, in addition to the etching time from the start of the etching of phase shift film 3 until the surface of etching stopper film 2 began to be exposed, with the etching progressing in the thickness direction of phase shift film 3 (just etching time), additional etching (over-etching) was performed for a period of time that was 20% of the just etching time (over-etching time). Note that this dry etching with a fluorine based gas was carried out under so-called high bias etching conditions with a bias power of 10 W applied.

Next, a resist film made of a chemically amplified resist for electron beam lithography was formed to a thickness of 150 nm onto light shielding pattern 4a by the spin coating method. Next, with respect to the resist film, the second pattern which is a pattern (light shielding pattern) to be formed on light shielding film 4 was drawn and predetermined treatments such as development processing were performed to form second resist pattern 7b having a light shielding pattern (see FIG. 3E). Subsequently, with second resist pattern 7b serving as a mask, dry etching with a mixed gas made up of chlorine and oxygen (gas flow ratio $Cl_2:O_2$=4:1) was performed to form the second pattern (light shielding pattern 4b) on light shielding film 4. In addition, second resist pattern 7b was removed with TMAH and predetermined treatments such as cleaning with ammonia-hydrogen peroxide were followed to obtain phase shift mask 200 (see FIG. 3F).

Halftone phase shift mask 200 of Example 1 that had been made was inspected with regards to mask pattern by a mask inspection device, which confirmed black defects on phase shift pattern 3a at the locations in which programmed defects had been arranged. Upon performing EB defect repair with respect to the black defect portions using an electron beam and $XeF_2$ gas, etching endpoints were easily detected and etching in the surface of etching stopper film 2 was minimized.

A phase shift mask was manufactured by similar procedures using another mask blank and the in-plane CD uniformity of the phase shift pattern was inspected, yielding good results. Furthermore, STEM observation of a cross section of the phase shift pattern revealed that the side walls of the phase shift pattern had high verticality and the etching stopper film had been minutely dug into by less than 1 nm, with no microtrenches generated.

With respect to halftone phase shift mask 200 of Example 1 on which EB defect repair had been performed, a simulation of transfer images transferred by exposure to a resist film on a semiconductor device with an exposure light having a wavelength of 193 nm was performed using AIMS 193 (manufactured by Carl Zeiss). Verification of the images transferred by exposure in this simulation revealed that the design specifications were sufficiently satisfied. The influence of the decreased transmittance at light transmissive portions due to the provision of etching stopper film 2 against exposure transfer was minute. Furthermore, the transfer images of the portions in which EB defect repair had been performed compared favorably with transfer images of other regions. From these results, one could argue that even if the phase shift mask of Example 1 on which EB defect repair had been performed was placed on the mask stage of an exposure apparatus and transferred by exposure to a resist film on a semiconductor device, the final circuit pattern formed on the semiconductor device could be formed with high accuracy.

Example 2

[Manufacture of Mask Blank]

The mask blank of this Example 2 is manufactured in a similar manner to the mask blank of Example 1 except for etching stopper film 2, phase shift film 3, and hard mask film 5. Hereinafter, differing points from the mask blank of Example 1 will be described.

For etching stopper film 2 of this Example 2, an AlSiO film (Al:Si:O=13:26:61 (atom % ratio)) made of aluminum, silicon, and oxygen was applied and formed to a thickness of 10 nm in contact with the surface of transparent substrate 1. In other words, Si/[Si+Al] for this etching stopper film 2 is 0.67. Furthermore, this etching stopper film 2 has a refractive index n of 1.600 along with an extinction coefficient k of 0.000 (measurement lower limit) with respect to light having a wavelength of 193 nm.

Phase shift film 3 of this Example 2 is in contact with the surface of etching stopper film 2 and has a structure in which a low transmittance layer, high transmittance layer, and uppermost layer are laminated. Specific film forming steps are as described below. Transparent substrate 1 on which etching stopper film 2 had been formed was installed in a single-wafer RF sputtering device, and low transmittance layer made of silicon and nitrogen (Si:N=59:41 (atom % ratio)) was formed in contact with the surface of etching stopper film 2 to a thickness of 12 nm by reactive sputtering (RF sputtering) in the metal mode region in which a silicon (Si) target was used, a mixed gas made up of argon (Ar) and nitrogen ($N_2$) (flow ratio Ar:$N_2$=2:3, pressure=0.035 Pa) served as the sputtering gas, and the power of the RF power supply was 2.8 kW. On the main surface of another transparent substrate, only a low transmittance layer was formed under the same conditions. Measurement of the optical characteristics of this low transmittance layer using the abovementioned spectral ellipsometer found a refractive index n of 1.85 along with an extinction coefficient k of 1.70 with respect to light having a wavelength of 193 nm.

Next, transparent substrate 1 on which a low transmittance layer had been laminated was installed in a single-wafer RF sputtering device, and a high transmittance layer made of silicon and nitrogen (Si:N=46:54 (atom % ratio)) was formed on the low transmittance layer to a thickness of 55 nm by reactive sputtering (RF sputtering) in the reactive mode (poison mode) region in which a silicon (Si) target was used, a mixed gas made up of argon (Ar) and nitrogen ($N_2$) (flow ratio Ar:$N_2$=1:3, pressure=0.09 Pa) served as the sputtering gas, and the power of the RF power supply was 2.8 kW. On the main surface of the other transparent substrate, only a high transmittance layer was formed under the same conditions. Measurement of the optical characteristics of this high transmittance layer using the abovementioned spectral ellipsometer found a refractive index n of 2.52 along with an extinction coefficient k of 0.39 with respect to light having a wavelength of 193 nm.

Next, transparent substrate 1 on which a low transmittance layer and a high transmittance layer had been laminated was installed in a single-wafer RF sputtering device, and an uppermost layer made of silicon and oxygen was formed on the high transmittance layer to a thickness of 4 nm by RF sputtering in which a silicon dioxide ($SiO_2$) target was used, argon (Ar) gas (pressure=0.03 Pa) served as the sputtering gas, and the power of the RF power supply was 1.5 kW. Note that on the main surface of the other transparent substrate, only an uppermost layer was formed under the same conditions. Measurement of the optical characteristics of this uppermost layer using the abovementioned spectral ellipsometer found a refractive index n of 1.56 along with an extinction coefficient k of 0.00 with respect to light having a wavelength of 193 nm.

Regarding this phase shift film 3 made of a low transmittance layer, high transmittance layer, and uppermost layer, measurement of transmittance and phase difference with respect to the wavelength of the light of the ArF excimer laser (approximately 193 nm) by the abovementioned phase shift measurement system found a transmittance of 5.97% and a phase difference of 177.7 degrees.

For the hard mask film of this Example 2, hard mask film ($SiO_2$ film Si:O=33:67 (atom % ratio)) 5 made of silicon and oxygen was formed in contact with the surface of light shielding film 4 to a thickness of 5 nm.

Measurement of the transmittance of an etching stopper film formed on another transparent substrate in the wavelength of the ArF excimer laser (193 nm) by the abovementioned phase shift measurement system found a transmittance of 99.4% assuming the transmittance of the transparent substrate is 100%, with the influence of the decrease in transmittance caused by the provision of the etching stopper film of this Example 2 found to be small. The transparent substrate on which an etching stopper film had been formed was immersed in ammonia water having a concentration of 0.5% to measure the etching rate, which was 0.1 nm/min. These results confirmed that etching stopper film 2 of this Example 2 has sufficient resistance to chemical cleaning performed during the process of manufacturing phase shift masks from mask blanks.

With respect to each of another transparent substrate, an etching stopper film formed on the other transparent substrate, and a phase shift film formed on the other transparent substrate, dry etching was performed under the same conditions using a mixed gas made up of $SF_6$ and He as the etching gas. Subsequently, the respective etching rates were calculated and the etching selection ratio between the three was calculated. The etching selection ratio of the etching stopper film of Example 2 to the etching rate of the transparent substrate was 0.2. The etching selection ratio of the phase shift film of Example 2 to the etching rate of the transparent substrate was 2.03. The etching selection ratio of the phase shift film of Example 2 to the etching rate of the etching stopper film of Example 2 was 10.15.

[Manufacture of Phase Shift Mask]

Next, phase shift mask 200 of Example 2 was made by procedures similar to those of Example 1 using mask blank 100 of this Example 2. Halftone phase shift mask 200 of Example 2 that had been made was inspected with regards to mask pattern by a mask inspection device, which confirmed black defects on phase shift pattern 3a at the locations in which programmed defects had been arranged. Upon performing EB defect repair with respect to the black defect portions using an electron beam and $XeF_2$ gas, etching endpoints were easily detected and etching in the surface of etching stopper film 2 was minimized.

A phase shift mask was manufactured by similar procedures using another mask blank and the in-plane CD uniformity of the phase shift pattern was inspected, yielding good results. Furthermore, STEM observation of a cross section of the phase shift pattern revealed that the side walls of the phase shift pattern had high verticality and the etching stopper film had been minutely dug into by less than 1 nm, with no microtrenches generated.

With respect to halftone phase shift mask 200 of Example 2 on which EB defect repair had been performed, a simulation of transfer images transferred by exposure to a resist film on a semiconductor device with an exposure light having a wavelength of 193 nm was performed using AIMS 193 (manufactured by Carl Zeiss). Verification of the images transferred by exposure in this simulation revealed that the design specifications were sufficiently satisfied. The influence of the decreased transmittance at light transmissive portions due to the provision of etching stopper film 2 against exposure transfer was minute. Furthermore, the transfer images of the portions in which EB defect repair had been performed compared favorably with transfer images of other regions. From these results, one could argue that even if the phase shift mask of Example 2 on which EB defect repair had been performed was placed on the mask stage of an exposure apparatus and transferred by exposure to a resist film on a semiconductor device, the final circuit pattern formed on the semiconductor device could be formed with high accuracy.

Example 3

[Manufacture of Mask Blank]

The mask blank of this Example 3 is manufactured in a similar manner to the mask blank of Example 2 except for etching stopper film 2. For etching stopper film 2 of this Example 3, an AlSiO film (Al:Si:O=7:28:65 (atom % ratio)) made of aluminum, silicon, and oxygen was applied and formed to a thickness of 10 nm in contact with the surface of transparent substrate 1. In other words, Si/[Si+Al] for this etching stopper film 2 is 0.8. Furthermore, this etching stopper film 2 has a refractive index n of 1.589 along with an extinction coefficient k of 0.000 (measurement lower limit) with respect to light having a wavelength of 193 nm.

Measurement of the transmittance of an etching stopper film formed on another transparent substrate in the wavelength of the ArF excimer laser (193 nm) by the abovementioned phase shift measurement system found a transmittance of 99.8% assuming the transmittance of the transparent substrate is 100%, with the influence of the decrease in transmittance caused by the provision of the etching stopper film of this Example 3 found to be small. The transparent substrate on which an etching stopper film had been formed was immersed in ammonia water having a concentration of 0.5% to measure the etching rate, which was 0.1 nm/min. These results confirmed that etching stopper film 2 of this Example 3 has sufficient resistance to chemical cleaning performed during the process of manufacturing phase shift masks from mask blanks.

With respect to each of another transparent substrate, an etching stopper film formed on the other transparent substrate, and a phase shift film formed on the other transparent substrate, dry etching was performed under the same conditions using a mixed gas made up of $SF_6$ and He as the etching gas. Subsequently, the respective etching rates were calculated and the etching selection ratio between the three was calculated. The etching selection ratio of the etching stopper film of Example 3 to the etching rate of the transparent substrate was 0.34. The etching selection ratio of the phase shift film of Example 3 to the etching rate of the transparent substrate was 2.03. The etching selection ratio of the phase shift film of Example 3 to the etching rate of the etching stopper film of Example 3 was 5.97.

[Manufacture of Phase Shift Mask]

Next, phase shift mask 200 of Example 3 was made by procedures similar to those of Example 1 using mask blank 100 of this Example 3. Halftone phase shift mask 200 of Example 3 that had been made was inspected with regards to mask pattern by a mask inspection device, which confirmed black defects on phase shift pattern 3a at the locations in which programmed defects had been arranged. Upon performing EB defect repair with respect to the black defect portions using an electron beam and $XeF_2$ gas, etching endpoints were easily detected and etching in the surface of etching stopper film 2 was minimized.

A phase shift mask was manufactured by similar procedures using another mask blank and the in-plane CD uniformity of the phase shift pattern was inspected, yielding good results. Furthermore, STEM observation of a cross section of the phase shift pattern revealed that the side walls of the phase shift pattern had high verticality and the etching stopper film had been minutely dug into by approximately 1 nm with no microtrenches generated.

With respect to halftone phase shift mask 200 of Example 3 on which EB defect repair had been performed, a simulation of transfer images transferred by exposure to a resist film on a semiconductor device with an exposure light having a wavelength of 193 nm was performed using AIMS 193 (manufactured by Carl Zeiss). Verification of the images transferred by exposure in this simulation revealed that the design specifications were sufficiently satisfied. The influence of the decreased transmittance at light transmissive portions due to the provision of etching stopper film 2 against exposure transfer was minute. Furthermore, the transfer images of the portions in which EB defect repair had been performed compared favorably with transfer images of other regions. From these results, one could argue that even if the phase shift mask of Example 3 on which EB defect repair had been performed was placed on the mask stage of an exposure apparatus and transferred by exposure to a resist film on a semiconductor device, the final circuit pattern formed on the semiconductor device could be formed with high accuracy.

Example 4

[Manufacture of Mask Blank]

The mask blank of this Example 4 is manufactured in a similar manner to the mask blank of Example 2 except for etching stopper film 2. For etching stopper film 2 of this Example 4, an AlSiO film (Al:Si:O=31:8:61 (atom % ratio))

made of aluminum, silicon, and oxygen was applied and formed to a thickness of 10 nm in contact with the surface of transparent substrate 1. In other words, Si/[Si+Al] for this etching stopper film 2 is 0.205. Furthermore, this etching stopper film 2 has a refractive index n of 1.720 along with an extinction coefficient k of 0.032 with respect to light having a wavelength of 193 nm.

Measurement of the transmittance of an etching stopper film formed on another transparent substrate in the wavelength of the ArF excimer laser (193 nm) by the abovementioned phase shift measurement system found a transmittance of 95.2% assuming the transmittance of the transparent substrate is 100%, with the influence of the decrease in transmittance caused by the provision of the etching stopper film of this Example 4 found to be small. The transparent substrate on which an etching stopper film had been formed was immersed in ammonia water having a concentration of 0.5% to measure the etching rate, which was 0.2 nm/min. These results confirmed that etching stopper film 2 of this Example 4 has sufficient resistance to chemical cleaning performed during the process of manufacturing phase shift masks from mask blanks.

With respect to each of another transparent substrate, an etching stopper film formed on the other transparent substrate, and a phase shift film formed on the other transparent substrate, dry etching was performed under the same conditions using a mixed gas made up of $SF_6$ and He as the etching gas. Subsequently, the respective etching rates were calculated and the etching selection ratio between the three was calculated. The etching selection ratio of the etching stopper film of Example 4 to the etching rate of the transparent substrate was 0.042. The etching selection ratio of the phase shift film of Example 4 to the etching rate of the transparent substrate was 2.03. The etching selection ratio of the phase shift film of Example 4 to the etching rate of the etching stopper film of Example 4 was 48.3.

[Manufacture of Phase Shift Mask]

Next, phase shift mask 200 of Example 4 was made by procedures similar to those of Example 1 using mask blank 100 of this Example 4. Halftone phase shift mask 200 of Example 4 that had been made was inspected with regards to mask pattern by a mask inspection device, which confirmed black defects on phase shift pattern 3a at the locations in which programmed defects had been arranged. Upon performing EB defect repair with respect to the black defect portions using an electron beam and an $XeF_2$ gas, etching endpoints were easily detected and etching in the surface of etching stopper film 2 was minimized.

A phase shift mask was manufactured by similar procedures using another mask blank and the in-plane CD uniformity of the phase shift pattern was inspected, yielding good results. Furthermore, STEM observation of a cross section of the phase shift pattern revealed that the side walls of the phase shift pattern had high verticality and the etching stopper film had been minutely dug into by less than 1 nm, with no microtrenches generated.

With respect to halftone phase shift mask 200 of Example 4 on which EB defect repair had been performed, a simulation of transfer images transferred by exposure to a resist film on a semiconductor device with an exposure light having a wavelength of 193 nm was performed using AIMS 193 (manufactured by Carl Zeiss). Verification of the images transferred by exposure in this simulation revealed that the design specifications were sufficiently satisfied. The influence of the decreased transmittance at light transmissive portions due to the provision of etching stopper film 2 against exposure transfer was minute. Furthermore, the transfer images of the portions in which EB defect repair had been performed compared favorably with transfer images of other regions. From these results, one could argue that even if the phase shift mask of Example 4 on which EB defect repair had been performed was placed on the mask stage of an exposure apparatus and transferred by exposure to a resist film on a semiconductor device, the final circuit pattern formed on the semiconductor device could be formed with high accuracy.

Example 5

[Manufacture of Mask Blank]

The mask blank of this Example 5 is for the purpose of manufacturing binary masks (transfer masks) and has a structure in which etching stopper film 2, light shielding film 8 having a laminated structure consisting of the lower layer and upper layer, and hard mask film 9 are laminated on transparent substrate 1 as illustrated in FIG. 4. Hereinafter, differing points from the mask blank of Example 1 will be described.

By procedures similar to those of Example 1, transparent substrate 1 was prepared, and etching stopper film 2 made of aluminum, silicon, and oxygen (AlSiO film Al:Si:O=21:19:60 (atom % ratio)) was formed to a thickness of 10 nm in contact with the surface of transparent substrate 1. In other words, Si/[Si+Al] for this etching stopper film 2 is 0.475. Etching stopper film 2 of this Example 5 was formed by procedures similar to those for the etching stopper film of Example 1, the characteristics thereof being similar to those of the etching stopper film of Example 1.

Next, in contact with the surface of etching stopper film 2, the lower layer (MoSiN film) of light shielding film 8 made of molybdenum, silicon, and nitrogen was formed to a thickness of 47 nm, after which the upper layer (MoSiN film) was formed to a thickness of 13 nm. Specifically, transparent substrate 1 on which etching stopper film 2 had been formed was installed in a single-wafer DC sputtering device, and the lower layer and upper layer of light shielding film 8 was formed by reactive sputtering (DC sputtering) in which a mixed sintered target of molybdenum (Mo) and silicon (Si) was used (Mo:Si=13:87 (atom % ratio)) and a mixed gas made up of argon (Ar) and nitrogen ($N_2$) served as the sputtering gas.

Next, with respect to transparent substrate 1 including light shielding film 8, heating treatment was performed at 450° C. for 30 minutes to reduce the film stress of light shielding film 8. Note that X-ray photoelectron spectroscopy analysis was performed with respect to a light shielding film formed on another transparent substrate by similar procedures and processed up to annealing. As a result, it was confirmed that the lower layer of the light shielding film was Mo:Si:N=9.2:68.3:22.5 (atom % ratio) and the upper layer in the vicinity of the lower layer side was Mo:Si:N:O=5.8:64.4:27.7:2.1 (atom % ratio). Furthermore, as for the front layer of the upper layer of the light shielding film, nitrogen accounted for 14.4 atom % and oxygen accounted for 38.3 atom %. Furthermore, measurement of the optical density of the light shielding film using the abovementioned spectral ellipsometer delivered a value of 3.0.

Next, hard mask film 9 (CrN film) made of chromium and nitrogen was formed to a thickness of 5 nm in contact with the surface of the upper layer of light shielding film 8. Specifically, transparent substrate 1 including heat treated light shielding film 8 was installed in a single-wafer DC sputtering device, and hard mask film 9 was formed by reactive sputtering (DC sputtering) in which a chromium (Cr) target was used and a mixed gas made up of argon (Ar) and nitrogen ($N_2$) served as the sputtering gas. X-ray photoelectron spectroscopy analysis of a hard mask film formed on another transparent substrate under the same conditions found that Cr:N=72:28 (atom % ratio). A mask blank of Example 5 was manufactured by the above procedures.

Note that measurement of the transmittance of an etching stopper film formed on another transparent substrate in the wavelength of the ArF excimer laser (193 nm) by the abovementioned phase shift measurement system found a transmittance of 98.3% assuming the transmittance of the transparent substrate is 100%, with the influence of the decrease in transmittance caused by the provision of the etching stopper film of this Example 5 found to be small. Furthermore, the transparent substrate on which an etching stopper film had been formed was immersed in ammonia water having a concentration of 0.5% to measure the etching rate, which was 0.1 nm/min. These results confirmed that etching stopper film 2 of this Example 5 has sufficient resistance to chemical cleaning performed during the process of manufacturing transfer masks from mask blanks.

With respect to each of another transparent substrate, an etching stopper film formed on the other transparent substrate, and a light shielding film formed on the other transparent substrate, dry etching was performed under the same conditions using a mixed gas made up of $SF_6$ and He as the etching gas. Subsequently, the respective etching rates were calculated and the etching selection ratio between the three was calculated. The etching selection ratio of the etching stopper film of Example 5 to the etching rate of the transparent substrate was 0.1. The etching selection ratio of the light shielding film of Example 5 to the etching rate of the transparent substrate was 1.9. The etching selection ratio of the light shielding film of Example 5 to the etching rate of the etching stopper film of Example 5 was 19.0.

[Manufacture of Transfer Mask]

Next, transfer mask 210 of Example 5 was made by the procedures below using the mask blank 110 of this Example 5. First, a resist film made of a chemically amplified resist for electron beam lithography was formed to a film thickness of 80 nm in contact with the surface of hard mask film 9 by the spin coating method. Next, with respect to this resist film, a transfer pattern to be formed on light shielding film 8 was drawn by an electron beam and predetermined development processing was performed to form resist pattern 10a (see FIG. 6A). Note that in the pattern drawn by an electron beam at this time, programmed defects had been added other than the transfer pattern to be rightfully formed so that black defects are formed on light shielding film 8.

Next, with resist pattern 10a serving as a mask, dry etching with a mixed gas made up of chlorine and oxygen (gas flow ratio $Cl_2:O_2$=4:1) was performed to form a light shielding pattern (hard mask pattern 9a) on hard mask film 9 (see FIG. 6B).

Next, resist pattern 10a was removed by TMAH. Subsequently, with hard mask pattern 9a serving as a mask, dry etching with a fluorine based gas ($SF_6$+He) was performed to form a transfer pattern (light shielding pattern 8a) on light shielding film 8 (see FIG. 6C). In this dry etching with a fluorine based gas, in addition to the etching time from the start of the etching of light shielding film 8 until the surface of etching stopper film 2 began to be exposed, with the etching progressing in the thickness direction of light shielding film 8 (just etching time), additional etching (over-etching) was performed for a period of time that was 20% of the just etching time (over-etching time). Note that this dry etching with a fluorine based gas was carried out under so-called high bias conditions with a bias power of 10 W applied.

In addition, the remaining hard mask pattern 9a was removed by dry etching with a mixed gas made up of a chlorine based gas and oxygen gas (gas flow ratio $Cl_2:O_2$=4:1) and predetermined treatments such as cleaning with ammonia-hydrogen peroxide were followed to obtain transfer mask 210 (see FIG. 6D).

Transfer mask 210 of Example 5 that had been made was inspected with regards to mask pattern by a mask inspection device, which confirmed black defects on light shielding pattern 8a at the locations in which programmed defects had been arranged. Upon performing EB defect repair with respect to the black defect portions using an electron beam and $XeF_2$ gas, etching endpoints were easily detected and etching in the surface of etching stopper film 2 was minimized.

A transfer mask was manufactured by similar procedures using another mask blank and the in-plane CD uniformity of the light shielding pattern was inspected, yielding good results. Furthermore, STEM observation of a cross section of the light shielding pattern revealed that the side walls of the light shielding pattern had high verticality and the etching stopper film had been minutely dug into by less than 1 nm, with no microtrenches generated.

With respect to transfer mask 210 of Example 5 on which EB defect repair had been performed, a simulation of transfer images transferred by exposure to a resist film on a semiconductor device with an exposure light having a wavelength of 193 nm was performed using AIMS 193 (manufactured by Carl Zeiss). Verification of the images transferred by exposure in this simulation revealed that the design specifications were sufficiently satisfied. The influence of the decreased transmittance at light transmissive portions due to the provision of etching stopper film 2 against exposure transfer was minute. Furthermore, the transfer images of the portions in which EB defect repair had been performed compared favorably with transfer images of other regions. From these results, one could argue that even if the transfer mask of Example 5 on which EB defect repair had been performed was placed on the mask stage of an exposure apparatus and transferred by exposure to a resist film on a semiconductor device, the final circuit pattern formed on the semiconductor device could be formed with high accuracy.

Comparative Example 1

[Manufacture of Mask Blank]

The mask blank of Comparative Example 1 has a configuration similar to the mask blank of Example 1 except that etching stopper film 2 was formed from a material made of aluminum and oxygen. For etching stopper film 2 of this Comparative Example 1, etching stopper film 2 made of aluminum and oxygen (AlO film) was formed to a thickness of 10 nm in contact with the surface of transparent substrate 1. Specifically, transparent substrate 1 was installed in a single-wafer RF sputtering device and etching stopper film 2 was formed by a sputtering (RF sputtering) in which an $Al_2O_3$ target was used and argon (Ar) gas served as the sputtering gas. X-ray photoelectron spectroscopy analysis of an etching stopper film formed on another transparent substrate under the same conditions found that Al:O=42:58 (atom % ratio). In other words, Si/[Si+Al] for this etching stopper film 2 is 0. Furthermore, this etching stopper film has a refractive index n of 1.864 along with an extinction coefficient k of 0.069 with respect to light having a wavelength of 193 nm.

Measurement of the transmittance of an etching stopper film formed on another transparent substrate in the wavelength of the ArF excimer laser (193 nm) by the abovementioned phase shift measurement system found a transmittance of 91.7% assuming the transmittance of the transparent substrate is 100%, with the influence of the decrease in transmittance caused by the provision of the etching stopper film of this Comparative Example 1 turning out to be relatively large. The transparent substrate on which an etching stopper film had been formed was immersed in ammonia water having a concentration of 0.5% to measure the etching rate, which was 4.0 nm/min. These results show that the etching stopper film 2 of this Comparative Example 1 does not have sufficient resistance to chemical cleaning performed during the process of manufacturing phase shift masks from mask blanks.

With respect to each of another transparent substrate, an etching stopper film formed on the other transparent substrate, and a phase shift film formed on the other transparent substrate, dry etching was performed under the same conditions using a mixed gas made up of $SF_6$ and He as the etching gas. Subsequently, the respective etching rates were calculated and the etching selection ratio between the three was calculated. The etching selection ratio of the etching stopper film of Comparative Example 1 to the etching rate of the transparent substrate was 0.025. The etching selection ratio of the phase shift film of Comparative Example 1 to the etching rate of the transparent substrate was 2.38. The etching selection ratio of the phase shift film of Comparative Example 1 to the etching rate of the etching stopper film of Comparative Example 1 was 95.2.

[Manufacture of Phase Shift Mask]

Next, phase shift mask 200 of Comparative Example 1 was made by procedures similar to those of Example 1 using mask blank 100 of this Comparative Example 1. Halftone phase shift mask 200 of Comparative Example 1 that had been made was inspected with regards to mask pattern by a mask inspection device, which detected many defects other than programmed defects. Investigation of each defect portion revealed that most defects were due to the dropout of phase shift pattern 3a. It should be noted that upon performing EB defect repair using an electron beam and $XeF_2$ gas with respect to black defect portions at locations in which programmed defects had been arranged, etching endpoints were easily detected and etching in the surface of etching stopper film 2 was minimized.

A phase shift mask was manufactured by similar procedures using another mask blank. With respect to locations in which the phase shift pattern had not dropped out, STEM observation of a cross section of the phase shift pattern revealed that the etching stopper film of light transmissive portions had disappeared (dissolved due to chemical cleaning) and even at the etching stopper film directly underneath the regions in which the phase shift pattern existed, dissolution was under way from the side wall side to the inner side of the phase shift pattern. From these results, it is conjectured that dissolution of the etching stopper film by chemical cleaning had been the factor causing many dropouts of the phase shift pattern.

With respect to halftone phase shift mask 200 of Comparative Example 1 on which EB defect repair had been performed, a simulation of transfer images transferred by exposure to a resist film on a semiconductor device with an exposure light having a wavelength of 193 nm was performed using AIMS 193 (manufactured by Carl Zeiss). Verification of the images transferred by exposure in this simulation revealed that the design specifications were not satisfied. Many locations were found in which normal exposure transfer could not be carried out due to the dropout of phase shift pattern 3a. Furthermore, even at locations in which phase shift pattern 3a itself had been accurately formed, a decrease in terms of the accuracy of transferred images apparently due to the low transmittance of etching stopper film 2 with respect to the ArF exposure light was observed. From these results, it is expected that regardless of the presence/absence of EB defect repairs, if the phase shift mask of Comparative Example 1 is placed in the mask stage of the exposure apparatus and transferred by exposure to a resist film on a semiconductor device, the final circuit pattern formed on the semiconductor device will suffer many disconnections and short circuits.

DESCRIPTION OF REFERENCE NUMERALS

1: Transparent substrate
2: Etching stopper film
3: Phase shift film (thin film for pattern formation)
3a: Phase shift pattern (transfer pattern)
4: Light shielding film
4a, 4b: Light shielding pattern
5, 9: Hard mask film
5a, 9a: Hard mask pattern
6a: First resist pattern
7b: Second resist pattern
8: Light shielding film (thin film for pattern formation)
8a: Light shielding pattern (transfer pattern)
10a: Resist pattern
100, 110: Mask blank
200: Phase shift mask (transfer mask)
210: Transfer mask

What is claimed is:

1. A mask blank comprising:
   a transparent substrate;
   a thin film for pattern formation provided on a main surface of the transparent substrate;
   an etching stopper film provided between the transparent substrate and the thin film for pattern formation,
   wherein the thin film for pattern formation contains silicon;
   wherein the etching stopper film is single layered film; and
   wherein the etching stopper film contains silicon, aluminum, and oxygen.

2. The mask blank according to claim 1, wherein the oxygen content of the etching stopper is 60 atom % or more.

3. The mask blank according to claim 1, wherein the ratio of the silicon content to the total content of silicon and aluminum in the etching stopper film is ⅘ or less in terms of atom %.

4. The mask blank according to claim 1, wherein the etching stopper film consists essentially of silicon, aluminum, and oxygen.

5. The mask blank according to claim 1, wherein the etching stopper film is formed in contact with the main surface of the transparent substrate.

6. The mask blank according to claim 1, wherein the etching stopper film has a thickness of 3 nm or more.

7. The mask blank according to claim 1, wherein the thin film for pattern formation contains silicon and nitrogen.

8. The mask blank according to claim 1, wherein the thin film for pattern formation contains a transition metal, silicon, and nitrogen.

9. The mask blank according to claim 1, wherein the thin film for pattern formation is a phase shift film.

10. The mask blank according to claim 9, wherein the phase shift film has a function to transmit exposure light at a transmittance of 1% or more, and a function to cause a phase difference of not less than 150 and not more than 180 degrees between the exposure light having transmitted through the phase shift film and the exposure light having passed through air for the same distance as the thickness of the phase shift film.

11. The mask blank according to claim 9, wherein the mask blank includes a light shielding film on the phase shift film.

12. The mask blank according to claim 1, wherein the etching stopper film has the difference in content of each constituent element in the thickness direction is within 5 atom %.

13. The mask blank according to claim 1, wherein the etching stopper film has an amorphous structure in a state including a bond of silicon and oxygen and a bond of aluminum and oxygen.

14. The mask blank according to claim 1, the etching stopper film is made of materials combined $Al_2O_3$ and $SiO_2$.

15. A transfer mask comprising:
a transparent substrate;
a thin film, having a pattern, provided on a main surface of the transparent substrate;
an etching stopper film provided between the transparent substrate and the thin film for pattern formation,
wherein the thin film for pattern formation contains silicon;
wherein the etching stopper film is single layered film; and
wherein the etching stopper film contains silicon, aluminum, and oxygen.

16. The transfer mask according to claim 15, wherein the oxygen content of the etching stopper is 60 atom % or more.

17. The transfer mask according to claim 15, wherein the ratio of the silicon content to the total content of silicon and aluminum in the etching stopper film is 4/5 or less in terms of atom %.

18. The transfer mask according to claim 15, wherein the etching stopper film consists essentially of silicon, aluminum, and oxygen.

19. The transfer mask according to claim 15, wherein the etching stopper film is formed in contact with the main surface of the transparent substrate.

20. The transfer mask according to claim 15, wherein the etching stopper film has a thickness of 3 nm or more.

21. The transfer mask according to claim 15, wherein the thin film contains silicon and nitrogen.

22. The transfer mask according to claim 15, wherein the thin film contains a transition metal, silicon, and nitrogen.

23. The transfer mask according to claim 15, wherein the thin film is a phase shift film.

24. The transfer mask according to claim 15, wherein the phase shift film has a function to transmit exposure light at a transmittance of 1% or more, and a function to cause a phase difference of not less than 150 and not more than 180 degrees between the exposure light having transmitted through the phase shift film and the exposure light having passed through air for the same distance as the thickness of the phase shift film.

25. The transfer mask according to claim 15, wherein the etching stopper film has the difference in content of each constituent element in the thickness direction is within 5 atom %.

26. The transfer mask according to claim 15, wherein the etching stopper film has an amorphous structure in a state including a bond of silicon and oxygen and a bond of aluminum and oxygen.

27. The transfer mask according to claim 15, the etching stopper film is made of materials combined $Al_2O_3$ and $SiO_2$.

28. The transfer mask according to claim 23, wherein the mask blank includes a light shielding film, having a pattern including a light shielding band, on the phase shift film.

29. A method of manufacturing a semiconductor device, including:
transferring by exposure a transfer pattern to a resist film on a semiconductor substrate using a transfer mask comprising:
a transparent substrate;
a thin film, having a pattern, provided on a main surface of the transparent substrate;
an etching stopper film provided between the transparent substrate and the thin film for pattern formation,
wherein the thin film for pattern formation contains silicon;
wherein the etching stopper film is single layered film; and
wherein the etching stopper film contains silicon, aluminum, and oxygen.

* * * * *